(12) United States Patent
Takahashi et al.

(10) Patent No.: US 7,345,521 B2
(45) Date of Patent: Mar. 18, 2008

(54) HIGH FREQUENCY SWITCH CIRCUIT

(75) Inventors: Yuji Takahashi, Tokyo (JP); Keiichi Numata, Tokyo (JP)

(73) Assignee: NEC Corporation, Tokyo (JP)

( * ) Notice: Subject to any disclaimer, the term of this patent is extended or adjusted under 35 U.S.C. 154(b) by 174 days.

(21) Appl. No.: 10/514,394

(22) PCT Filed: May 19, 2003

(86) PCT No.: PCT/JP03/06185

§ 371 (c)(1),
(2), (4) Date: Nov. 15, 2004

(87) PCT Pub. No.: WO03/098805

PCT Pub. Date: Nov. 27, 2003

(65) Prior Publication Data
US 2005/0179506 A1 Aug. 18, 2005

(30) Foreign Application Priority Data
May 17, 2002 (JP) .............................. 2002-143140
Apr. 25, 2003 (JP) .............................. 2003-122361

(51) Int. Cl.
*H03L 5/00* (2006.01)
(52) U.S. Cl. ...................... 327/308; 333/81 R; 333/101
(58) Field of Classification Search ...................... None
See application file for complete search history.

(56) References Cited

U.S. PATENT DOCUMENTS 5,554,892 A * 9/1996 Norimatsu .................. 307/115
6,853,235 B2 * 2/2005 Nakayama et al. ........... 327/379
6,987,414 B2 * 1/2006 Numata ....................... 327/365
7,023,258 B2 * 4/2006 Hamase ....................... 327/308
7,106,121 B2 * 9/2006 Hidaka et al. ............... 327/308

FOREIGN PATENT DOCUMENTS

| JP | 06-140898 | | 5/1994 |
|---|---|---|---|
| JP | 6-276052 | * | 9/1994 |
| JP | 08-139014 | | 5/1996 |
| JP | 10-084267 | | 3/1998 |
| JP | H10-242829 | | 9/1998 |

* cited by examiner

*Primary Examiner*—Tuan T Lam
(74) *Attorney, Agent, or Firm*—Scully, Scott, Murphy & Presser, P.C.

(57) ABSTRACT

A high-frequency switch circuit has a plurality of high-frequency switches for passing and blocking a high-frequency signal between an input terminal and an output terminal depending on a control potential applied as a control signal, a high-frequency detecting terminal for detecting high-frequency signal passing through the high-frequency switch which is in ON-state, and a voltage boosting circuit for generating a potential for increasing the control potential applied to the high-frequency switch which is in ON-state in order to increase difference between the control potential applied to the high-frequency switch which is in an ON-state and the control potential applied to the high-frequency switch which is in an OFF-state, depending on an intensity or amplitude of the detected high-frequency signal.

34 Claims, 14 Drawing Sheets

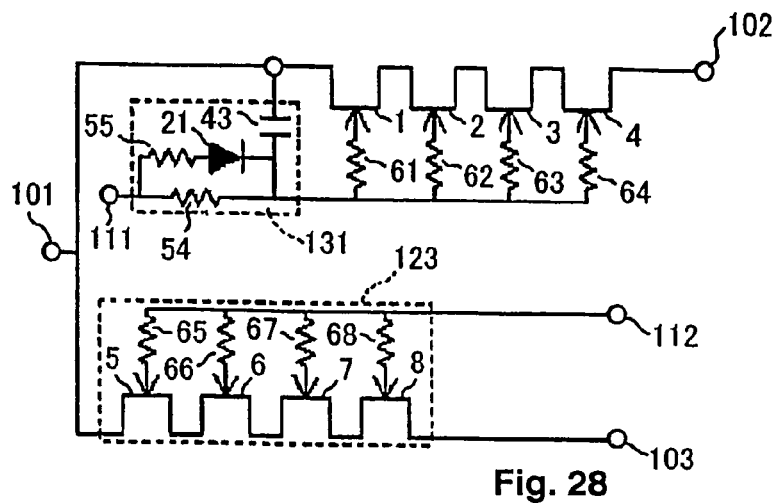
Fig. 28
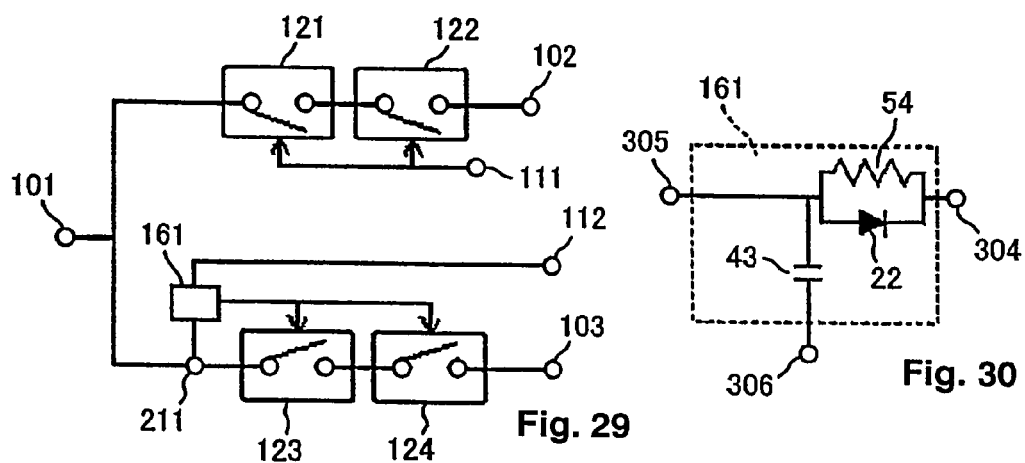
Fig. 29
Fig. 30
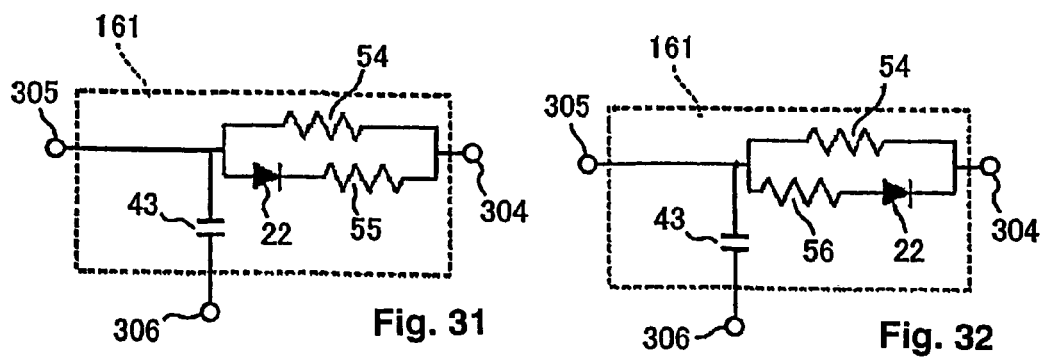
Fig. 31
Fig. 32

US 7,345,521 B2

HIGH FREQUENCY SWITCH CIRCUIT

TECHNICAL FIELD

The present invention relates to a high-frequency switch circuit, and more particularly to a high-frequency switch circuit which is of a small size and is capable of switching between high electric power levels.

BACKGROUND ART

Known high-frequency switch circuits that are controlled by control potentials which are input as control signals employ field-effect transistors (FETs) or diodes. For example, Japanese Patent Laid-open Application No. 8-139014 (JP-A-08-139014) discloses a high-frequency switch circuit having a SPDT (Single-Pole, Double-Throw) structure which is made up of a plurality of cascaded FETs integrated on a GaAs substrate, as a semiconductor integrated circuit (IC).

FIG. 1 shows such a conventional SPDT circuit by way of example. The high-frequency switch circuit shown in FIG. 1 has three high-frequency terminals 901 to 903 and two control potential input terminals 911, 912 for being supplied with control potentials as control signals from an external circuit, high-frequency terminal 901 serving as a common terminal. N-channel FETs 931 to 935 having respective channels (drains-sources) connected in cascade are connected between high-frequency terminal 901 and high-frequency terminal 902. Similarly, N-channel FETs 936 to 940 having respective channels connected in cascade are connected between high-frequency terminal 901 and high-frequency terminal 903. FETs 931 to 940 have respective gates connected to ends of respective resistive elements 951 to 960. The opposite ends of resistive elements 951 to 955 that are connected to the gates of FETs 931 to 935 are connected in common to control signal input terminal 911, and the opposite ends of resistive elements 956 to 960 that are connected to the gates of FETs 936 to 940 are connected in common to control signal input terminal 912.

In this configuration, control potentials having binary levels, i.e., a high level and low level, are complementarily applied as control signals from an external circuit to control potential input terminals 911 and 912 for controlling the high-frequency switch circuit to perform switching operation. Specifically, when a high-level potential is applied to control potential input terminal 911 and a low-level potential is applied to control potential input terminal 912, FETs 931 to 935 are turned on and FETs 936 to 940 are turned off, connecting high-frequency terminals 901 and 902 to each other and disconnecting high-frequency terminals 901 and 903 from each other. Conversely, when a low-level potential is applied to control potential input terminal 911 and a high-level potential is applied to control potential input terminal 912, FETs 931 to 935 are turned off and FETs 936 to 940 are turned on, disconnecting high-frequency terminals 901 and 902 from each other and connecting high-frequency terminals 901, 903 to each other.

In recent years, devices equipped with high-frequency switch circuits are designed for being supplied with lower power supply voltages for lower electric power consumption, and hence control potentials to be applied to high-frequency switch circuits tend to be lower. The maximum handling power $P_{max}$ that can be handled by the conventional high-frequency switch circuit shown in FIG. 1 is expressed by:

$$P_{max}=2(n(V_H-V_L-V_T))^2/Z_0 \quad (1)$$

where $V_H$ represents the high-level potential of switch control signal, $V_L$ the low-level potential of switch control signal, n the number of FETs connected in cascade, $V_T$ the threshold voltage of the FETs, and $Z_0$ the impedance of the measuring system. When the high-level control potential of the switch becomes lower, $V_H$ in equation (1) becomes lower, resulting in a reduction in the handling power. Though the handling power can be increased by increasing the number of FETs connected in cascade, the increased number of FETs is liable to a corresponding increase in the chip area of the high-frequency switch circuit that is constructed as an integrated circuit.

Japanese Patent Laid-open Application No. 10-84267 (JP-A-10-084267) discloses a high-frequency switch circuit wherein, in the case of that the number n of cascaded FETs is 1, in order to substantially increase the control potential applied to the gate of the FET, a portion of a high-frequency signal that is input from a high-frequency signal path to the switch is detected to generate a DC potential proportional to the wave crest of the high-frequency signal, and the DC potential is applied as a control potential to the gate of the FET depending on a control signal from an external circuit.

The high-frequency switch circuit with a plurality of cascaded FETs is disadvantageous in that as the control potential is lowered, the handling power is lowered, and that if the handling power is to be increased, then the number of cascaded FETs is increased, resulting in an increase in the size of the high-frequency switch circuit constructed as an integrated circuit.

The high-frequency switch circuit as disclosed in JP-A-10-084267 is problematic in that in order to make a selection as to whether the DC potential generated from the high-frequency signal is to be applied to the gate of the FET or not, the FET for high-frequency switching and a selector circuit, i.e., the switch circuit and a power supply and a control signal for controlling the switch circuit, are required, with the result that the chip area of the high-frequency switch circuit constructed as an integrated circuit tends to increase.

DISCLOSURE OF THE INVENTION

It is an object of the present invention to provide a high-frequency switch circuit which is of a smaller size and has a higher handling power in its operation at lower control potentials.

According to the present invention, a high-frequency switch circuit has a circuit for generating a potential depending on the amplitude of a high-frequency signal that is input, the potential being greater when a high-frequency switch is in an ON-state and smaller when the high-frequency switch is in an OFF-state. The generated potential is added to a control potential.

A high-frequency switch circuit according to the present invention includes a plurality of high-frequency switch means for passing and blocking a high-frequency signal between an input terminal and an output terminal depending on a control potential applied as a control signal, detecting means for detecting the high-frequency signal which passes through the high-frequency switch means, and a control potential generating circuit for changing the control potential applied to at least one of the plurality of high-frequency switch means in order to increase the difference between the control potential applied to the high-frequency switch means which is in an ON-state and the control potential applied to the high-frequency switch means which is in an OFF-state, depending on the amplitude of the high-frequency signal detected by the detecting means.

According to a first aspect of the present invention, a high-frequency switch circuit has a plurality of high-frequency switch means for passing and blocking a high-frequency signal between an input terminal and an output terminal depending on an applied control potential, detecting means for detecting the high-frequency signal which passes through the high-frequency switch means which is in an ON-state, and a control potential generating circuit for generating a potential to increase the control potential applied to the high-frequency switch means which is in an ON-state in order to increase the difference between the control potential applied to the high-frequency switch means which is in an ON-state and the control potential applied to the high-frequency switch means which is in an OFF-state, depending on the amplitude or intensity of the high-frequency signal detected by the detecting means. The control potential generating circuit comprises a voltage boosting circuit only or a combination of a voltage boosting circuit and a voltage lowering circuit.

According to the first aspect, in the high-frequency switch circuit, the control potential is increased by the control potential generating circuit depending on the amplitude of the high-frequency signal that is input. If the control potential is increased in the same manner for a field-effect transistor (FET) which is in an ON-state and an FET which is in an OFF-state, then $V_H-V_L$ in the above equation (1) remains unchanged, and hence the handling power is not increased. According to the present invention, an increase in the control potential on the FET in an ON-state is made greater than an increase in the control potential on the FET in an OFF-state. As a result, $V_H-V_L$ in the equation (1) increases, thereby increasing the handling power.

According to a second aspect of the present invention, a high-frequency switch circuit has a plurality of high-frequency switch means for passing and blocking a high-frequency signal between an input terminal and an output terminal depending on an applied control potential, detecting means for detecting the high-frequency signal which passes through the high-frequency switch means which is in an ON-state, and a control potential generating circuit for generating a negative potential to lower the control potential applied to the high-frequency switch means which is in an OFF-state in order to increase the difference between the control potential applied to the high-frequency switch means which is in an ON-state and the control potential applied to the high-frequency switch means which is in an OFF-state, depending on the amplitude or intensity of the high-frequency signal detected by the detecting means. The control potential generating circuit comprises a voltage lowering circuit only or a combination of a voltage boosting circuit and a voltage lowering circuit.

According to the second aspect, in the high-frequency switch circuit, the control potential is lowered by the control potential generating circuit depending on the amplitude of the high-frequency signal that is input. If the control potential is lowered in the same manner for a field-effect transistor (FET) which is in an ON-state and an FET which is in an OFF-state, then $V_H-V_L$ in the equation (1) remains unchanged, and hence the handling power is not increased. According to the present invention, a reduction in the control potential on the FET in an OFF-state is made greater than a reduction in the control potential on the FET in an ON-state. As a result, $V_H-V_L$ in the equation (1) increases, thereby increasing the handling power.

According to the first and second aspects described above of the present invention, the gate potential of the FET in the ON-state side or the OFF-state side is increased or lowered to increase $V_H-V_L$ in equation (1), thereby increasing the handling power. Therefore, a high-frequency switch circuit may be constructed to incorporate both the arrangements according to the first and second aspects.

According to the present invention, the control potential generating circuit increases the difference between the control potential applied to the high-frequency switch means which is in an ON-state and the control potential applied to the high-frequency switch means which is in an OFF-state, as the input amplitude of the high-frequency signal detected by the high-frequency switch means increases. According to the present invention, therefore, $V_H-V_L$ indicated in the equation (1) increases, and the handling power can be increased without increasing the number n of FETs connected in cascade. The high-frequency switch circuit does not require control signals from an external circuit except for control potential signals of switches, i.e., switching signals.

According to the first aspect of the invention, the control potential generating circuit automatically makes the magnitude of an increase in the potential greater when the high-frequency switch means is in an ON-state and makes the magnitude of an increase in the potential smaller when the high-frequency switch means is in an OFF-state, depending on the ON-state and the OFF-state of the high-frequency switch means. Therefore, it is not necessary to control the increase in the control potential. Similarly, according to the second aspect of the invention, the control potential generating circuit automatically makes the magnitude of a reduction in the potential greater when the high-frequency switch means is in an OFF-state and makes the magnitude of a reduction in the potential smaller when the high-frequency switch means is in an ON-state, depending on the ON-state and the OFF-state of the high-frequency switch means. Consequently, it is not necessary to control the reduction in the control potential.

According to the present invention, therefore, even if a control potential is low, a high-frequency switch circuit having a high handling power capability can be realized in a small chip area.

BRIEF DESCRIPTION OF THE DRAWINGS

FIG. 28 is a circuit diagram showing a specific circuit arrangement of the high-frequency switch circuit according to the sixth embodiment;

FIG. 29 is a block diagram showing a high-frequency switch circuit according to a seventh embodiment of the present invention;

FIGS. 30 to 32 are circuit diagrams showing specific examples of the arrangements of voltage lowering circuits;

BEST MODE FOR CARRYING OUT THE INVENTION

Preferred embodiments of the present invention will be described below with reference to the drawings.

Figure 1:
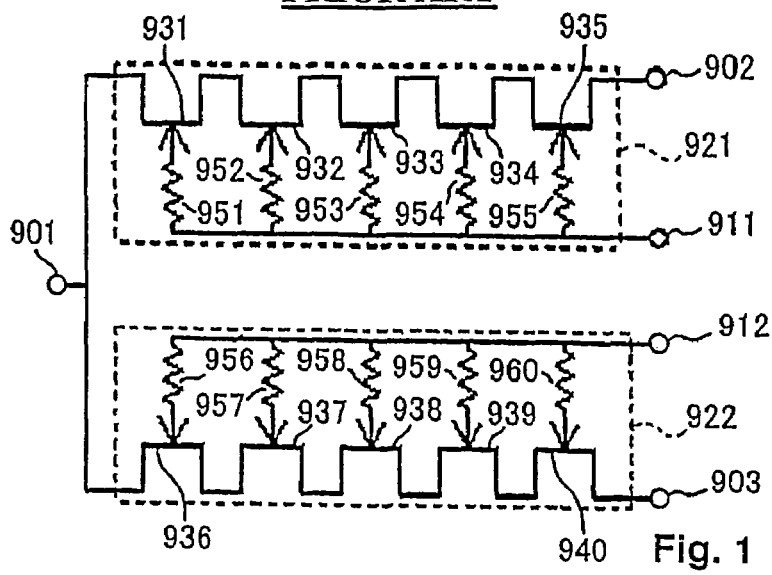
FIG. 1 is a circuit diagram showing the arrangement of a conventional high-frequency switch circuit.
Figure 2:
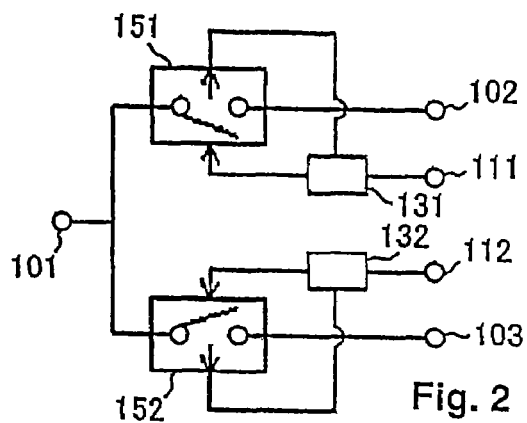
FIG. 2 is a block diagram showing a high-frequency switch circuit according to a first embodiment of the present invention.

FIG. 2 is a block diagram showing a schematic arrangement of a high-frequency switch circuit according to a first embodiment of the present invention.

The high-frequency switch circuit shown in FIG. 2 is suitable for being arranged as a semiconductor integrated circuit, and is configured as an SPDT circuit. The high-frequency switch circuit has high-frequency terminal 101 as a common terminal, first high-frequency circuit section 151 having an input terminal connected to high-frequency terminal 101, high-frequency terminal 102 connected to an output terminal of first high-frequency circuit section 151, second high-frequency circuit section 152 having an input terminal connected to high-frequency terminal 101, high-frequency terminal 103 connected to an output terminal of second high-frequency circuit section 152, first and second control potential input terminals 111, 112 for being supplied with a pair of complementary control potentials, i.e., control signals, first voltage boosting circuit 131 having an input terminal connected to first control potential input terminal 111, and second voltage boosting circuit 132 having an input terminal connected to second control potential input terminal 112.

Each of high-frequency circuit sections 151, 152 has a control terminal and a high-frequency detecting terminal in addition to the input and output terminals, and connects or disconnects the input and output terminals depending on a control potential that is applied as a control signal to the control terminal. Each of high-frequency circuit sections 151, 152 has a high-frequency detecting terminal for detecting and outputting the intensity or amplitude of a high-frequency signal that passes therethrough when it is turned on. The high-frequency circuit sections may comprise, for example, a high-frequency switch made up of cascaded FETs (Field-Effect Transistors) and a circuit for detecting a high-frequency signal, as described later.

First voltage boosting circuit 131 serves to supply the control terminal of corresponding first high-frequency switch circuit section 151 with a control signal (control potential) that is input to first control potential input terminal 111. When first high-frequency switch circuit section 151 is in an ON-state, first voltage boosting circuit 131 increases the potential of the control signal supplied to first high-frequency switch circuit section 151. First voltage boosting circuit 131 has a high-frequency detecting terminal connected to the high-frequency detecting terminal of first high-frequency switch circuit section 151. Similarly, second voltage boosting circuit 132 serves to supply the control terminal of second high-frequency switch circuit section 152 with a control signal (control potential). When second high-frequency switch circuit section 152 is in an ON-state, second voltage boosting circuit 132 increases the potential of the control signal input from second control potential input terminal 112 and supplies the control signal to second high-frequency switch circuit section 152. Second voltage boosting circuit 132 has a high-frequency detecting terminal connected to the high-frequency detecting terminal of second high-frequency switch circuit section 152.

Figure 3:
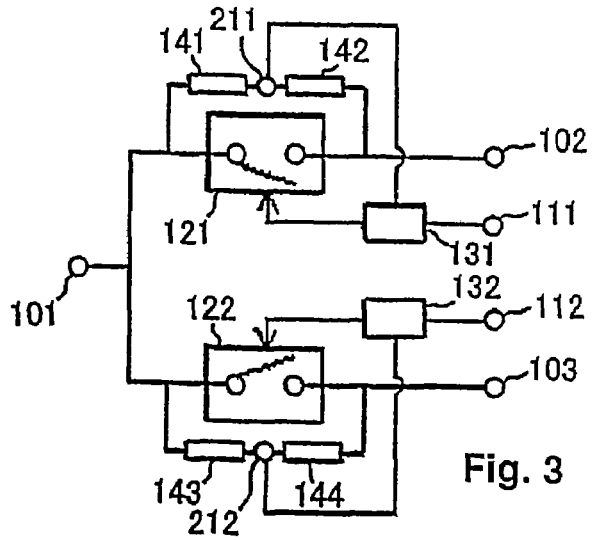
FIG. 3 is a block diagram illustrative of high-frequency detection in the circuit shown in FIG. 2.

High-frequency detection in high-frequency switch circuit sections 151, 152 will be described below. As shown in FIG. 3, the high-frequency detection can be achieved by connecting potential dividing circuits between the input and output terminals of the high-frequency switches in the high-frequency switch circuit sections. Each of the potential dividing circuits has two potential dividing elements connected in series to each other, with the high-frequency detecting terminal extending from the midpoint between the potential dividing elements. FIG. 3 is a diagram showing the high-frequency detection in the high-frequency switch circuit shown in FIG. 2. In FIG. 3, potential dividing elements 141, 142 are connected in series between the input and output terminals of high-frequency switch 121 of first high-frequency switch circuit section 151, and the midpoint (junction) between potential dividing elements 141, 142 is used as high-frequency detecting terminal 211 of high-frequency switch circuit section 151. Likewise, potential dividing elements 143, 144 are connected in series between the input and output terminals of high-frequency switch 122 of second high-frequency switch circuit section 152, and the midpoint (junction) between potential dividing elements 143, 144 is used as high-frequency detecting terminal 212 of high-frequency switch circuit section 152. Any of resistive elements, capacitive elements, and inductive elements may be used as potential dividing elements 141 to 144, and an arrangement in which resistive elements, capacitive elements, or inductive elements are connected either in series or parallel to each other may be used as potential dividing elements 141 to 144.

Specific examples of potential dividing elements 141 to 144, as typified by potential dividing element 141, will be described below.

Figure 4:
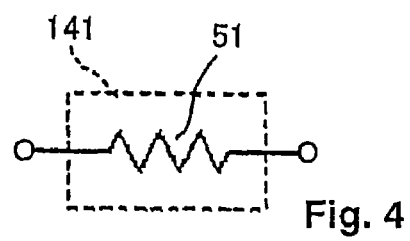
FIGS. 4 to 8 are circuit diagrams showing specific examples of the arrangements of potential dividing elements.
Figure 5:
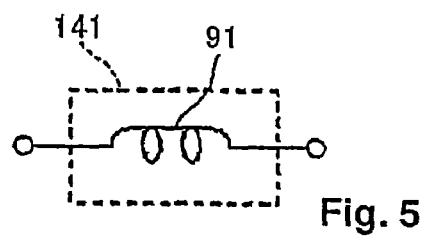
Figure 6:
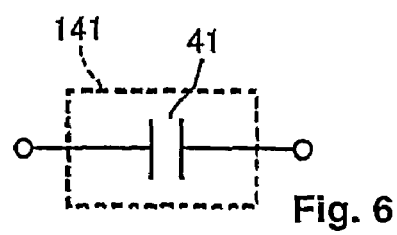
Figure 7:
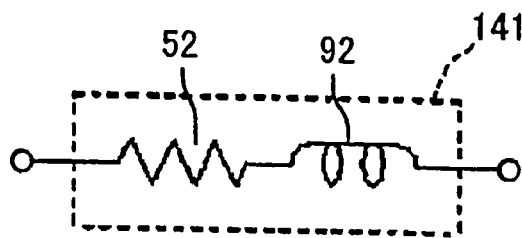
Figure 8:
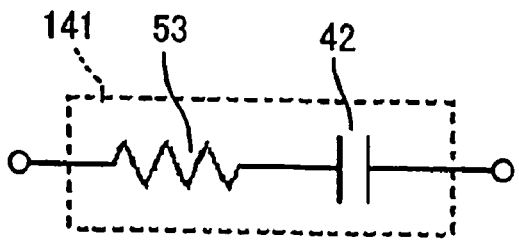

FIG. 4 shows potential dividing element 141 comprising resistive element 51, FIG. 5 shows potential dividing element 141 comprising inductive element 91, FIG. 6 shows potential dividing element 141 comprising capacitive element 41, FIG. 7 shows potential dividing element 141 comprising resistive element 52 and inductive element 92 which are connected in series to each other, and FIG. 8 shows potential dividing element 141 comprising resistive element 53 and capacitive element 42 which are connected in series to each other.

Figure 9:
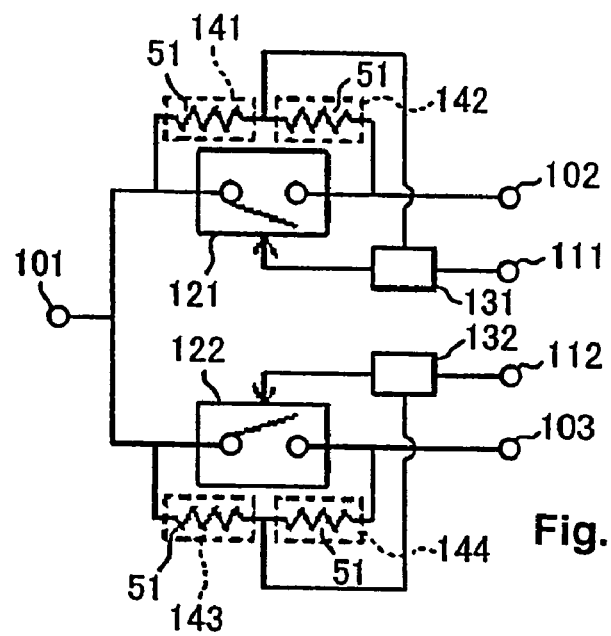
FIG. 9 is a block diagram illustrating a high-frequency switch circuit which employs resistive elements as potential dividing elements.
Figure 10:
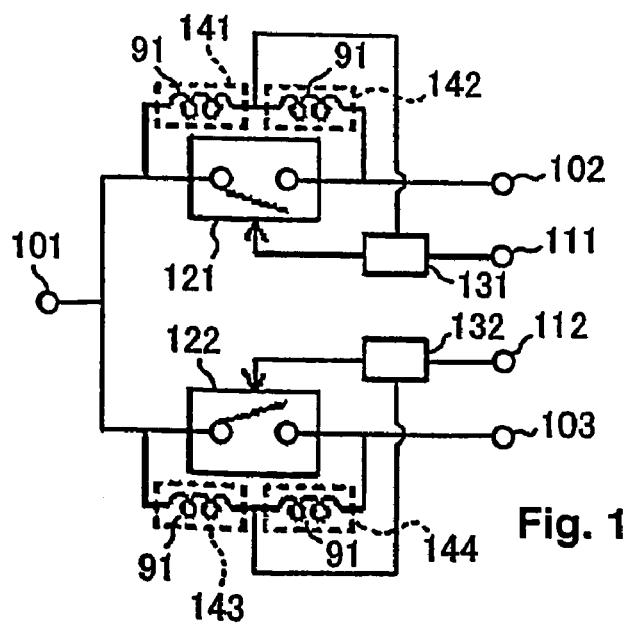
FIG. 10 is a block diagram illustrating a high-frequency switch circuit which employs inductive elements as potential dividing elements.
Figure 11:
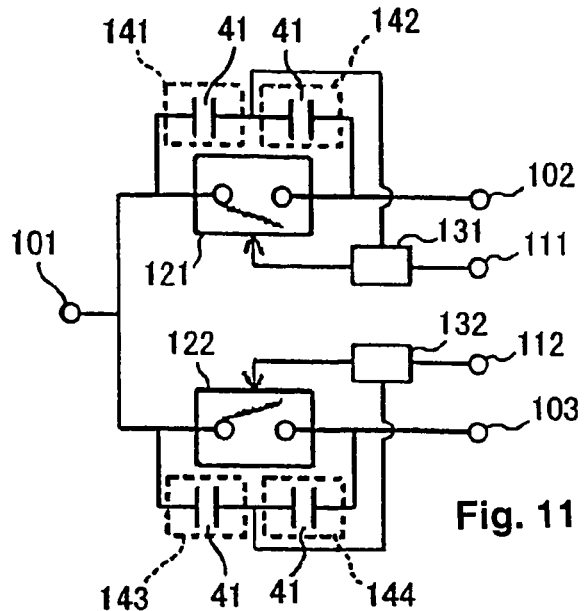
FIG. 11 is a block diagram illustrating a high-frequency switch circuit which employs capacitive elements as potential dividing elements.

High-frequency switch circuits employing such potential dividing elements are specifically illustrated in FIGS. 9 to 11.

FIG. 9 shows an example of the circuit illustrated in FIG. 3 where resistive elements 51 are employed as potential dividing elements 141 to 144, FIG. 10 shows an example of the circuit illustrated in FIG. 3 where inductive elements 91 are employed as potential dividing elements 141 to 144, and FIG. 11 shows an example of the circuit illustrated in FIG. 3 where capacitive elements 41 are employed as potential dividing elements 141 to 144.

Voltage boosting circuits 131, 132 will be described below. Since voltage boosting circuits 131, 132 are usually identical in circuit arrangement, voltage boosting circuit 131 will be described below.

Figure 12:
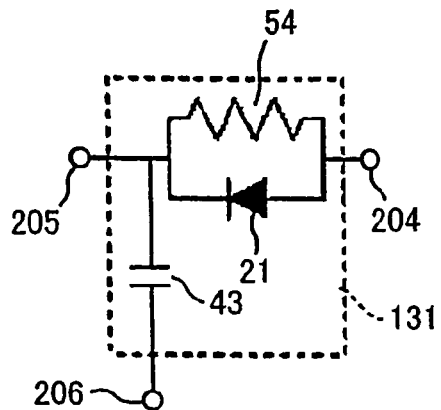
FIGS. 12 to 15 are circuit diagrams showing specific examples of the arrangements of voltage boosting circuits.
Figure 13:
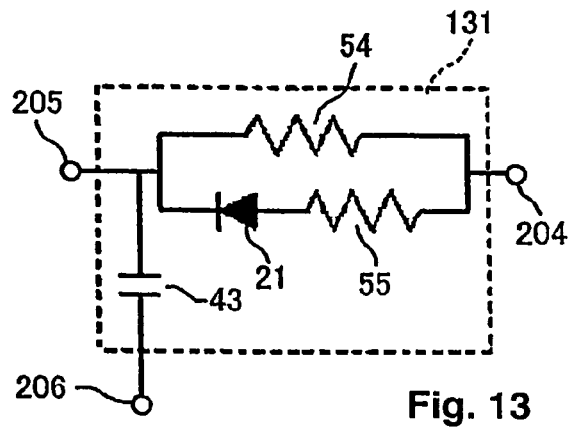
Figure 14:
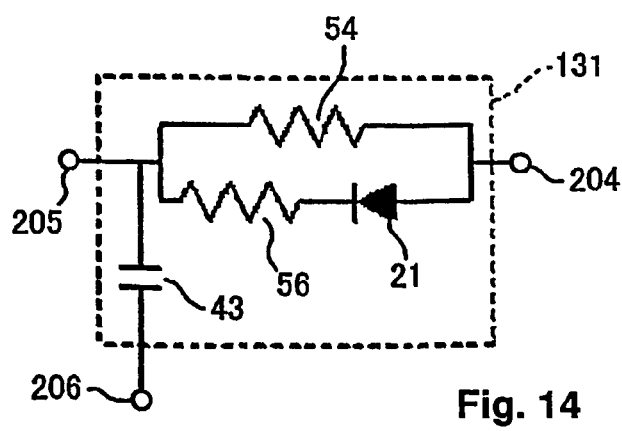
Figure 15:
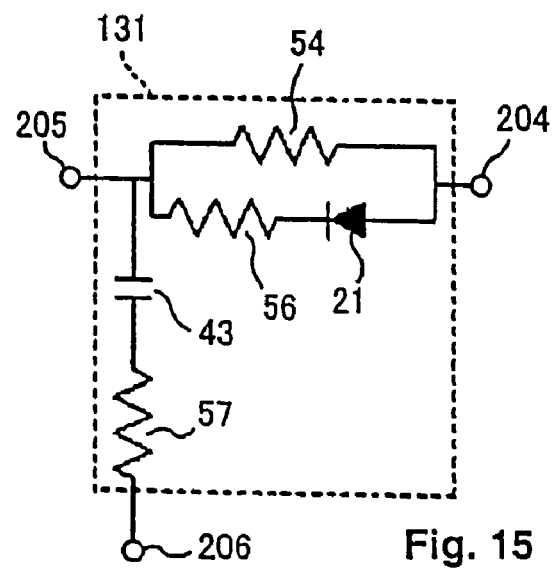

FIG. 12 shows an example of voltage boosting circuit 131. Resistive element 54 is connected between input terminal 204 and output terminal 205 of voltage boosting circuit 131. Diode element 21 is connected parallel to resistive element 54. The anode of diode element 21 is connected to input terminal 204, and the cathode thereof is connected to output terminal 205. Capacitive element 43 is connected between high-frequency detecting terminal 206 and output terminal 205 of voltage boosting circuit 131. As shown in FIG. 13, resistive element 55 may be inserted between input terminal 204 and the anode of diode element 21. As shown in FIG. 14, resistive element 56 may be inserted between output terminal 205 and the cathode of diode element 21. As shown in FIG. 15, resistive element 57 may be connected in series to capacitive element 43. Though resistive element 57 is connected in series to capacitive element 43 in the example shown in FIG. 15, a circuit constructed of an inductive element, a resistive element, and a capacitive element may be inserted instead of resistive element 57 shown in FIG. 15.

In this voltage boosting circuit, capacitive element 43 connected between high-frequency detecting terminal 206 and output terminal 205 may be replaced with a signal detector including a capacitive element. The signal detector is constructed of a capacitive element only or a circuit including a capacitive element. The circuit including a capacitive element is constructed of a circuit including all or some of a resistive element, an inductive element, and a capacitive element, and a capacitive element connected in series to the circuit.

High-frequency switches 121, 122 will be described below. The high-frequency switches should preferably comprise an FET having a gate to which a control signal, i.e., a control potential, is applied via a resistor, or a cascade connection of such FETs. If FETs are connected in cascade, then the FETs are combined with respective resistors whose ends are connected to the gates of the corresponding FETs and whose other ends are connected in common to a control terminal to which a control signal is input. Since high-frequency switches 121, 122 are usually identical in circuit arrangement, high-frequency switch 121 will typically be described below.

Figure 16:
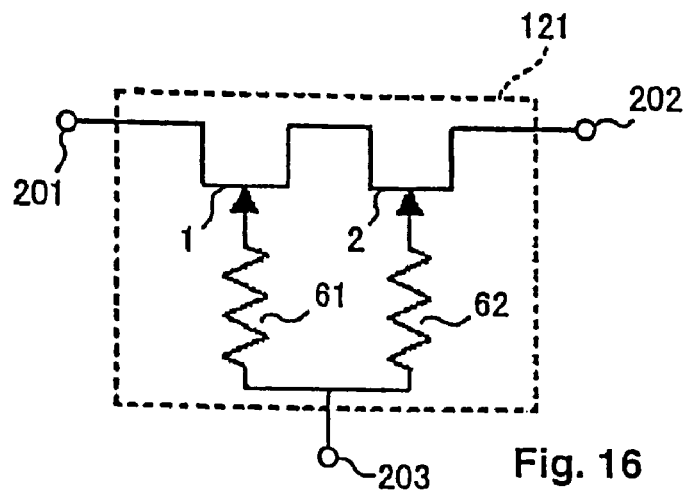
FIGS. 16 and 17 are circuit diagrams showing specific examples of the arrangements of high-frequency switches.

High-frequency switch 121 shown in FIG. 16 has two N-channel FETs 1, 2 having respective channels connected in cascade between input terminal 201 and output terminal 202 and respective gates connected to ends of respective resistive elements 61, 62 whose other ends are connected in common to control terminal 203. While two FETs are connected in cascade in FIG. 16, a single FET may be employed or three or more FETs may be connected in cascade.

Figure 17:
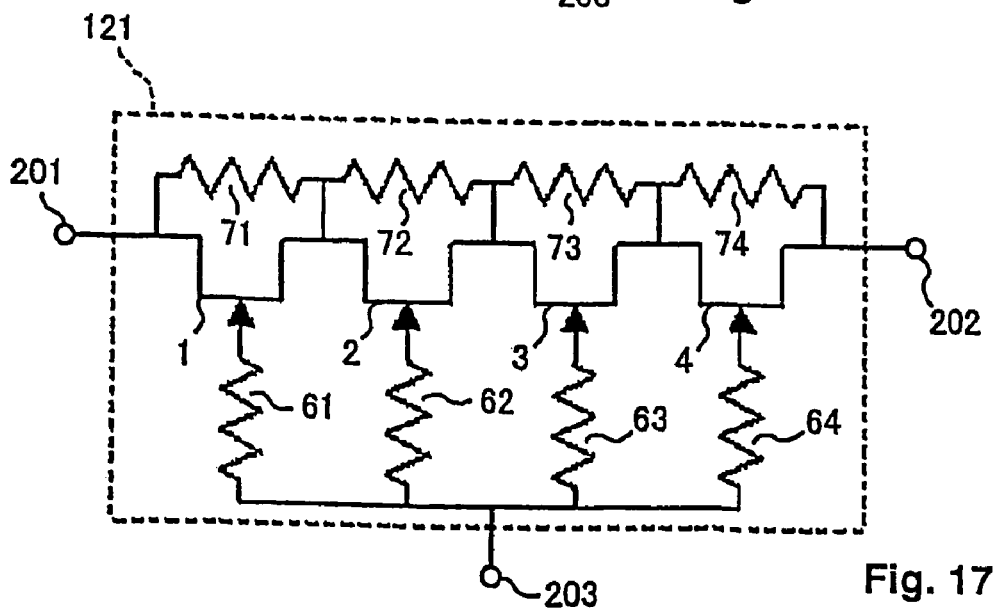

In order to equalize the drain-to-source voltages of the cascaded FETs, resistive elements having a resistance of several kilo-ohms or more may be connected parallel to the drains and sources of the respective FETs. FIG. 17 shows a high-frequency switch having resistive elements connected between the drains and sources. Specifically, high-frequency switch 121 shown in FIG. 17 has four FETs 1 to 4 having respective channels connected in cascade between input terminal 201 and output terminal 202 and resistive elements 71 to 74 having a resistance of several kilo-ohms or more interconnecting the drains and sources of respective FETs 1 to 4. FETs 1 to 4 have respective gates connected to ends of respective resistive elements 61 to 64 whose other ends are connected in common to control terminal 203.

While four FETs 1 to 4 are connected in cascade in FIG. 17, a single FET may be connected between input terminal 201 and output terminal 202, or other than four FETs may be connected in cascade.

Figure 18:
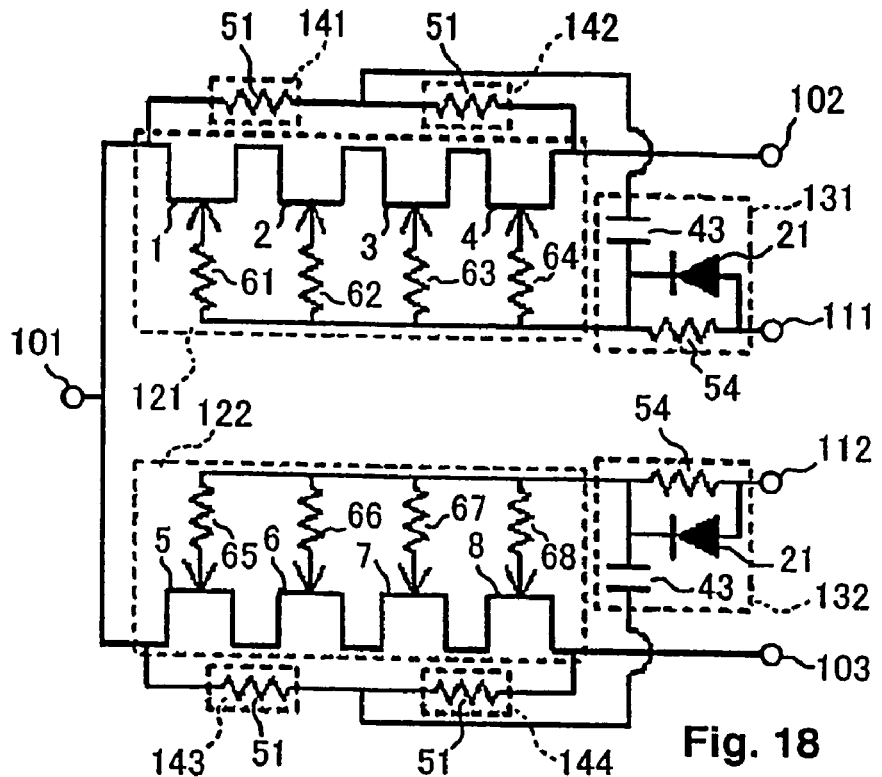
FIGS. 18 and 19 are circuit diagrams showing specific circuit arrangements of the high-frequency switch circuit according to the first embodiment.
Figure 19:
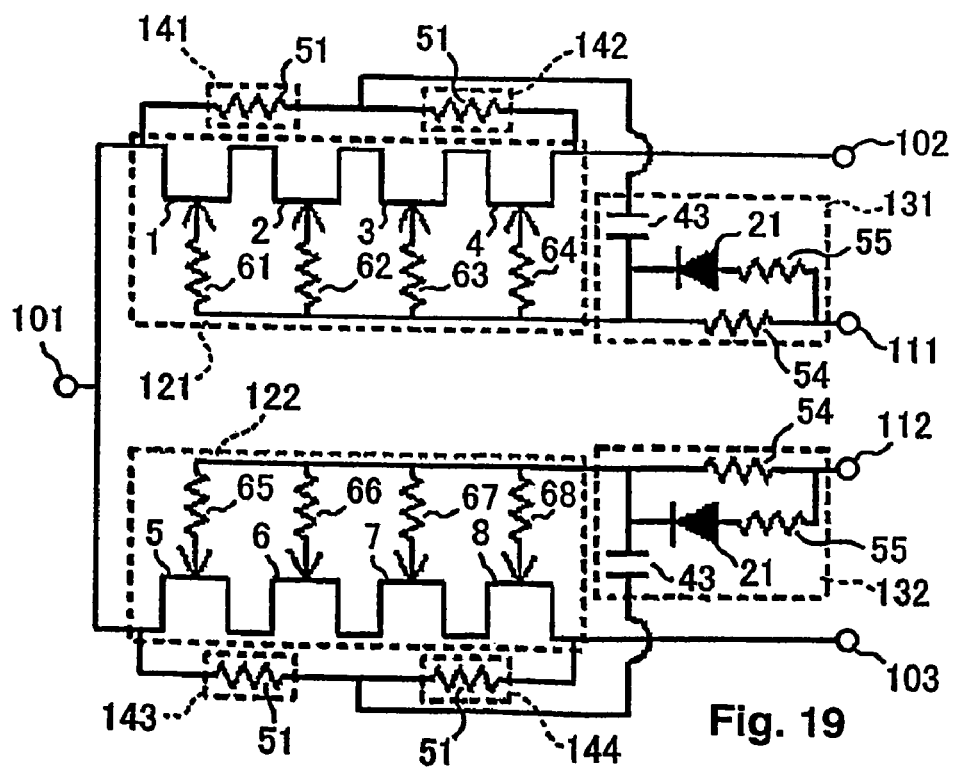

FIG. 18 shows a specific arrangement of the circuit shown in FIG. 3, which includes four N-channel FETs connected in cascade as each of high-frequency switches 121, 122, resistive element 51 as each of potential dividing elements 141 to 144, and the circuit shown in FIG. 12 as each of voltage boosting circuits 131, 132. Similarly, FIG. 19 shows another specific arrangement of the circuit shown in FIG. 3, which includes four N-channel FETs connected in cascade as each of high-frequency switches 121, 122, resistive element 51 as each of potential dividing elements 141 to 144, and the circuit shown in FIG. 13 as each of voltage boosting circuits 131, 132.

Operation of the high-frequency switch circuit according to the first embodiment will be described below.

Referring again to FIG. 3, control potentials having binary levels, i.e., high and low levels, are complementarily applied as control signals to control potential input terminals 111, 112. It is assumed that a high-level potential is applied to control potential input terminal 111 and a low-level potential is applied to control potential input terminal 112. When a high-frequency signal is input to high-frequency terminal 101 at this time, since high-frequency switch 121 is in an ON-state, the signal is output to high-frequency terminal 102. Therefore, a signal having the same amplitude as the high-frequency input signal can be detected at high-frequency detecting terminal 211. Since high-frequency switch 122 is in an OFF-state, no signal is output to high-frequency terminal 103. In an ordinary usage mode, as high-frequency terminals 101 to 103 are terminated, the amplitude of the signal at high-frequency terminal 102 connected to high-frequency switch 122 that is in an OFF-state is considered to be substantially zero if a signal component flowing in from the potential dividing circuit is ignored. Therefore, a signal having a reduced amplitude produced when the high-frequency input signal is divided by the potential dividing circuit is detected at high-frequency detecting terminal 212.

Voltage boosting circuits 131, 132 connected respectively to high-frequency switches 121, 122 operate as follows: Since voltage boosting circuits 131, 132 operate in the same manner irrespective of which one of the circuits shown in FIGS. 12 to 15 is employed, it is assumed that voltage boosting circuit 131 shown in FIG. 12 is employed.

The high-frequency signal detected at high-frequency detecting terminal 212 of the high-frequency switch side is input to high-frequency detecting terminal 206 of voltage boosting circuit 131. The high-frequency signal is detected by diode 21, and a detected asymmetric current flows in from diode 21. As a result, a potential higher than the potential at input terminal 204 appears at output terminal 205 of voltage boosting circuit 131. Since the high-frequency signal detected by the high-frequency switch is of the same magnitude as the high-frequency input signal when the high-frequency switch is in an ON-state and is smaller than high-frequency input signal when the high-frequency switch is in an OFF-state, the difference between the control potential input to the high-frequency switch in an ON-state and the control potential input to the high-frequency switch in an OFF-state increases as the input amplitude of the high-frequency signal increases. Consequently, $(V_H-V_L)$ in the equation (1) increases. Therefore, even if the control potentials input to control potential input terminals 111, 112 are low, this high-frequency switch circuit can have its handling power increased without having to increase the number of FETs connected in cascade.

Figure 20:
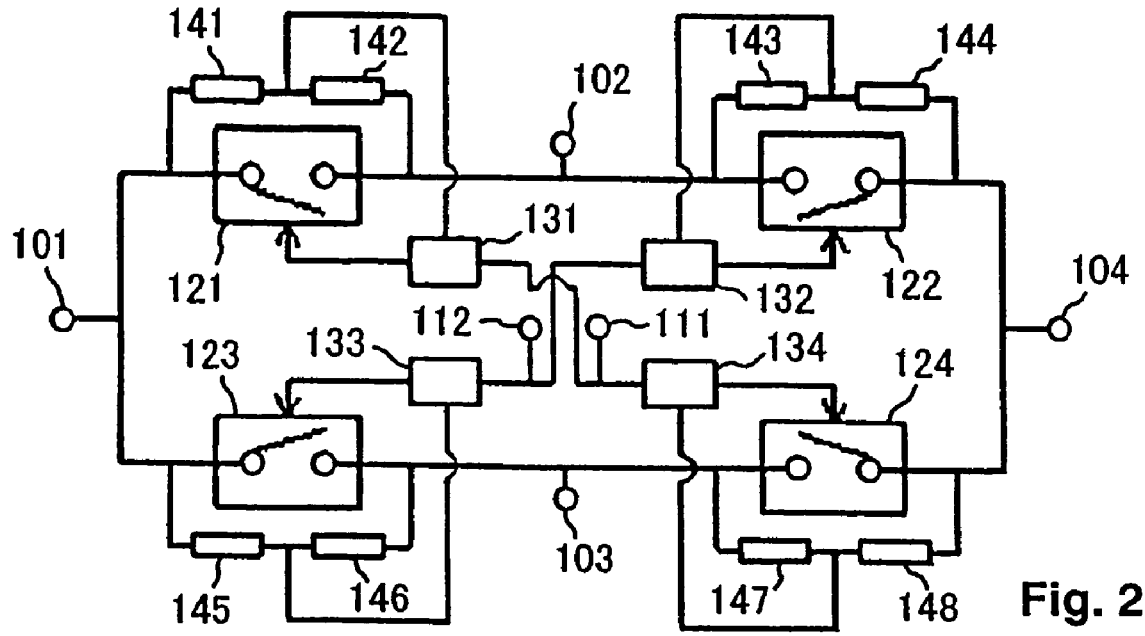
FIG. 20 is a block diagram showing a high-frequency switch circuit according to a second embodiment of the present invention.

A second embodiment of the present invention will be described below. According to the first embodiment, the SPDT circuit has been described. However, the present invention is applicable to not only the SPDT circuit, but also a circuit having a greater number of high-frequency switches or high-frequency switch circuit sections. FIG. 20 shows a high-frequency switch circuit according to the second embodiment of the present invention.

The high-frequency switch circuit shown in FIG. 20 is a DPDT (Double-Pole, Double-Throw) circuit and has two high-frequency terminals 101, 104 for being supplied with high-frequency signals, two high-frequency terminals 102, 103 for outputting high-frequency signals, high-frequency switch 121 and potential dividing elements 141, 142 connected between high-frequency terminals 101, 102, high-frequency switch 122 and potential dividing elements 143, 144 connected between high-frequency terminals 104, 102, high-frequency switch 123 and potential dividing elements 145, 146 connected between high-frequency terminals 101, 103, high-frequency switch 124 and potential dividing elements 147, 148 connected between high-frequency terminals 104, 103, voltage boosting circuits 131 to 134 connected respectively to high-frequency switches 121 to 124, and a pair of control potential input terminals 111, 112. Control potential input terminal 111 is connected to voltage boosting circuits 131, 134, and control potential input terminal 112 is connected to voltage boosting circuits 132, 133. Potential dividing elements 141 to 148 may employ the arrangements shown in FIGS. 4 to 8. Voltage boosting circuits 131 to 134 may employ the arrangements shown in FIGS. 12 to 15.

This high-frequency switch circuit corresponds to a circuit which employs two SPDT circuits each shown in FIG. 3, which have respective high-frequency terminals 102 connected in common and respective high-frequency terminals 103 connected in common, and control potential input terminals 111, 112 connected in a crossing configuration. Since each of the SPDT circuits operates in the same manner as with the first embodiment, when a high-level control potential is applied to control potential input terminal 111 as a control signal and a low-level control potential is applied to control potential input terminal 112, a high-frequency signal input from high-frequency signal 101 is output from high-frequency terminal 103, and a high-frequency signal input from high-frequency signal 104 is output from high-frequency terminal 102. Inasmuch as an increased control potential is applied to a high-frequency switch that is in an ON-state, even when the control potentials input to control potential input terminals 111, 1112 are low, the high-frequency switch circuit can have its handling power increased without having to increase the number of FETs connected in cascade.

Figure 21:
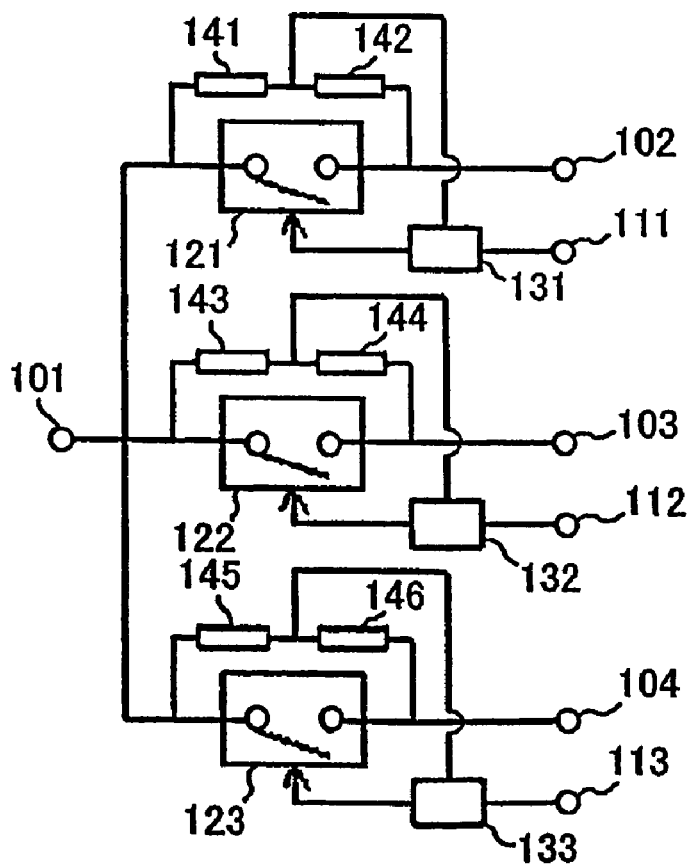
FIG. 21 is a block diagram showing a high-frequency switch circuit according to a third embodiment of the present invention.

A third embodiment of the present invention will be described below. A high-frequency switch circuit according to the third embodiment shown in FIG. 21 is constructed as an SP3T (Single-Pole, Triple-Throw) circuit. This high-frequency switch circuit has high-frequency terminal 101 for being supplied with a high-frequency signal, three high-frequency terminals 102 to 104 for outputting high-frequency signals, high-frequency switch 121 and potential dividing elements 141, 142 connected between high-frequency terminals 101, 102, high-frequency switch 122 and potential dividing elements 143, 144 connected between high-frequency terminals 101, 103, high-frequency switch 123 and potential dividing elements 145, 146 connected between high-frequency terminals 101, 104, voltage boosting circuits 131 to 133 connected respectively to high-frequency switches 121 to 123, and control potential input terminals 111 to 113 connected respectively to voltage boosting circuits 131 to 133.

The high-frequency switch circuit is the same as the high-frequency switch circuit shown in FIG. 3, with third high-frequency switch 123, third voltage boosting circuit 133, and potential dividing elements 145, 146 added thereto. The added circuit portion is identical to the circuit portion made up of first high-frequency switch 121, first voltage boosting circuit 131, and potential dividing elements 141, 142. Therefore, the added circuit portion operates in the same manner as the circuit portion made up of first voltage boosting circuit 131 and potential dividing elements 141, 142 in the high-frequency switch circuit according to the first embodiment. With this high-frequency switch circuit, control signals are applied such that a high-level control signal is applied to either one of control potential input terminals 111 to 113 and a low-level control signal is applied to the remaining two control potential input terminals. As a result, a high-frequency signal input to high-frequency terminal 101 is output through the high-frequency switch corresponding to the control potential input terminal at the high level from the corresponding high-frequency terminal. In this case, since an increased control potential is applied to the high-frequency switch that is in an ON-state, even if the control potentials input to the control potential input terminals are low, the present high-frequency switch circuit can have its handling power increased without having to increase the number of FETs connected in cascade.

While the present invention has been described as being applied to the DPDT circuit and the SP3T circuit, the present invention is also applicable to a high-frequency switch circuit having a greater number of high-frequency switches.

A fourth embodiment of the present invention will be described below. In the first to third embodiments described above, the potential dividing circuit is provided for detecting a high-frequency signal from the high-frequency switch which is in an ON-state. High-frequency switches may be connected in cascade to detect a high-frequency signal that passes through the high-frequency switches which are in an ON-state, without the need for a potential dividing circuit. In this case, a high-frequency signal may be detected from the junction between the high-frequency switches.

Figure 22:
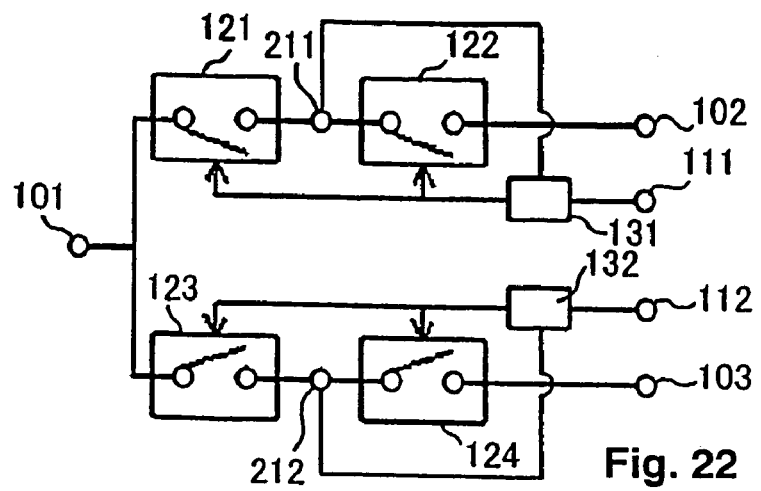
FIG. 22 is a block diagram showing a high-frequency switch circuit according to a fourth embodiment of the present invention.

FIG. 22 shows an example of the arrangement of such a high-frequency switch circuit. The switch circuit has high-frequency terminals 101 to 103, high-frequency switches 121 to 124, voltage boosting circuits 131 to 134, and control potential input terminals 111, 112. High-frequency switch 122 has an output terminal connected to high-frequency terminal 102 and an input terminal connected to the output terminal of high-frequency switch 121, the junction between high-frequency switches 121, 122 serving as high-frequency detecting terminal 211. High-frequency switch 124 has an output terminal connected to high-frequency terminal 103 and an input terminal connected to the output terminal of high-frequency switch 123, the junction between high-frequency switches 123, 124 serving as high-frequency detecting terminal 212. The input terminals of high-frequency switches 121, 123 are connected to high-frequency terminal 101. Voltage boosting circuit 131 has an input terminal connected to control potential input terminal 111 and an output terminal connected to the control terminals of high-frequency switches 121, 122. Voltage boosting circuit 131 has a high-frequency detecting terminal connected to the output terminal of high-frequency switch 121, i.e., high-frequency detecting terminal 211. Similarly, voltage boosting circuit 132 has an input terminal connected to control potential input terminal 112 and an output terminal connected to the control terminals of high-frequency switches 123, 124. Voltage boosting circuit 132 has a high-frequency detecting terminal connected to the output terminal of high-frequency switch 123, i.e., high-frequency detecting terminal 212.

Voltage boosting circuits 131, 132 may employ either one of the arrangements shown in FIGS. 12 to 15. High-frequency switches 121 to 124 may employ the arrangement shown in FIG. 16 or 17. Of course, the number of cascaded FETs in the high-frequency switches is not limited to those shown in FIGS. 16 and 17, i.e., two or four.

Figure 23:
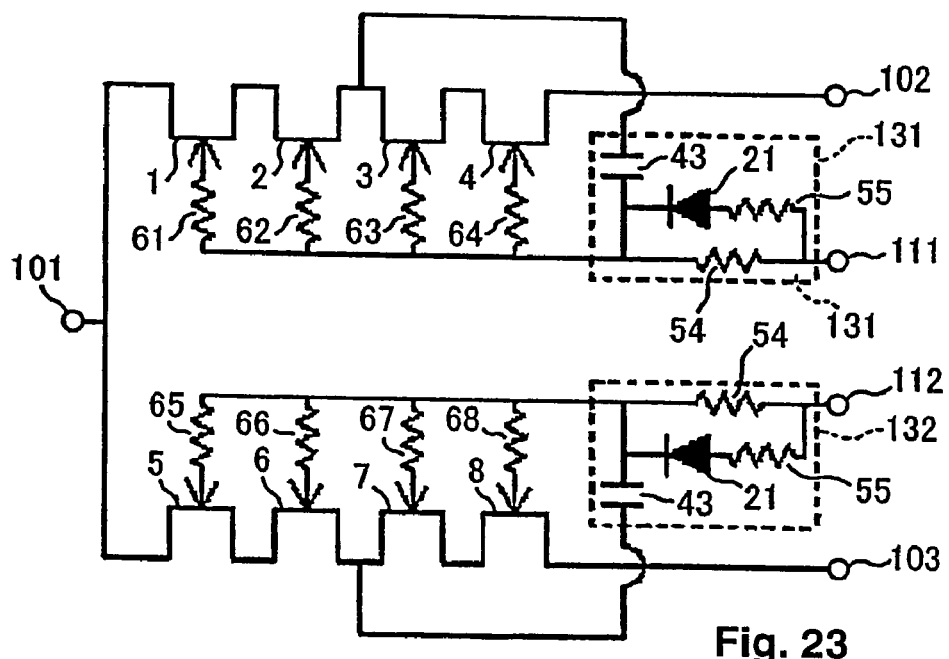
FIG. 23 is a circuit diagram showing a specific circuit arrangement of the high-frequency switch circuit according to the fourth embodiment.

FIG. 23 shows a specific circuit arrangement of the high-frequency switch circuit according to the fourth embodiment. FETs 1, 2 connected in cascade and resistive elements 61, 62 connected to the respective gates of FETs 1, 2 make up high-frequency switch 121. Similarly, FETs 3, 4 and resistive elements 63, 64 make up high-frequency switch 122. FETs 5, 6 and resistive elements 65, 66 make up high-frequency switch 123, and FETs 7, 8 and resistive elements 67, 68 make up high-frequency switch 124. Voltage boosting circuits 131, 133 employ the arrangement shown in FIG. 13.

Operation of the high-frequency switch circuit according to the fourth embodiment will be described below.

Referring again to FIG. 22, control potentials having binary levels, i.e., high and low levels, are complementarily applied as control signals to control potential input terminals 111, 112. It is assumed that a high-level potential is applied to control potential input terminal 111 and a low-level potential is applied to control potential input terminal 112. When a high-frequency signal is input to high-frequency terminal 101 at this time, since high-frequency switches 121, 122 are in an ON-state, the high-frequency signal is output to high-frequency terminal 102. Therefore, a signal having the same amplitude as the high-frequency input signal can be detected at high-frequency detecting terminal 211. On the contrary, since high-frequency switches 123, 124 are in an OFF-state, no signal is output to high-frequency terminal 103. In an ordinary usage mode, as the high-frequency terminals are terminated, the amplitude of the signal at high-frequency terminal 102 connected to high-frequency switch. 124 that is in an OFF-state is considered to be substantially zero if a signal component flowing in from the potential dividing circuit is ignored. Therefore, a signal having a reduced amplitude produced when the high-frequency input signal is divided at the ratio of the impedances of the high-frequency switches connected in cascade is detected at high-frequency detecting terminal 212.

Voltage boosting circuits 131, 132 connected to high-frequency switches 121 to 124 operate as follows: Since voltage boosting circuits 131, 132 operate in the same manner irrespective of which one of the circuits shown in FIGS. 12 to 15 is employed, it is assumed that voltage boosting circuit 131 shown in FIG. 12 is employed.

The high-frequency signal detected at high-frequency detecting terminal 212 of the high-frequency switch side is input to high-frequency detecting terminal 206 of voltage boosting circuit 131. The high-frequency signal is detected by diode 21, and a detected asymmetric current flows in from diode 21. As a result, a potential higher than the potential at input terminal 204 appears at output terminal 205 of voltage boosting circuit 131. Since the high-frequency signal detected by the high-frequency switch side is of the same magnitude as the high-frequency input signal when the high-frequency switch is in an ON-state and is smaller than the high-frequency input signal when the high-frequency switch is in an OFF-state, the difference between the control potential input to the high-frequency switch in an ON-state and the control potential input to the high-frequency switch in an OFF-state increases as the input amplitude of the high-frequency signal increases. Consequently, $(V_H - V_L)$ in the equation (1) increases. Therefore, even if the control potentials input to control potential input terminals 111, 112 are low, this high-frequency switch circuit can have its handling power increased without having to increase the number of FETs connected in cascade.

A fifth embodiment of the present invention will be described below. In the fourth embodiment, the junction between high-frequency switches connected in cascade is used as a detecting terminal. Input and output terminals of a high-frequency switch may also be used as a detecting terminal for the same advantages.

Figure 24:
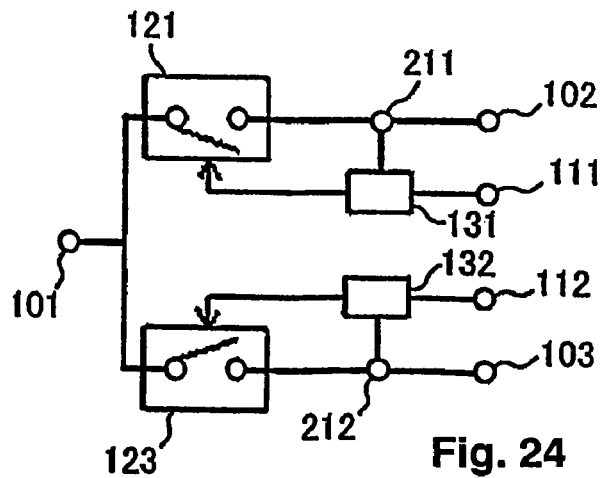
FIG. 24 is a block diagram showing a high-frequency switch circuit according to a fifth embodiment of the present invention.

FIG. 24 shows an example of the arrangement of such a high-frequency switch circuit. The switch circuit has high-frequency terminals 101 to 103, high-frequency switches 121, 123, voltage boosting circuits 131, 132, and control potential input terminals 111, 112. High-frequency switch 121 has an output terminal connected to high-frequency terminal 102 and serving as high-frequency detecting terminal 211. High-frequency switch 123 has an output terminal connected to high-frequency terminal 103 and serving as high-frequency detecting terminal 212. High-frequency switches 121, 123 have respective input terminals connected to high-frequency terminal 101. Voltage boosting circuit 131 has an input terminal connected to control potential input terminal 111 and an output terminal connected to the control terminal of high-frequency switch 121. Voltage boosting circuit 131 has a high-frequency detecting terminal connected to the output terminal of high-frequency switch 121, i.e., high-frequency detecting terminal 211. Similarly, voltage boosting circuit 132 has an input terminal connected to control potential input terminal 112 and an output terminal connected to the control terminal of high-frequency switch 123. Voltage boosting circuit 132 has a high-frequency detecting terminal connected to the output terminal of high-frequency switch 123, i.e., high-frequency detecting terminal 212.

Voltage boosting circuits 131, 132 may employ either one of the arrangements shown in FIGS. 12 to 15. High-frequency switches 121 to 124 may employ the arrangement shown in FIG. 16 or 17. Of course, the number of cascaded FETs in the high-frequency switches is not limited to those shown in FIGS. 16 and 17.

Figure 25:
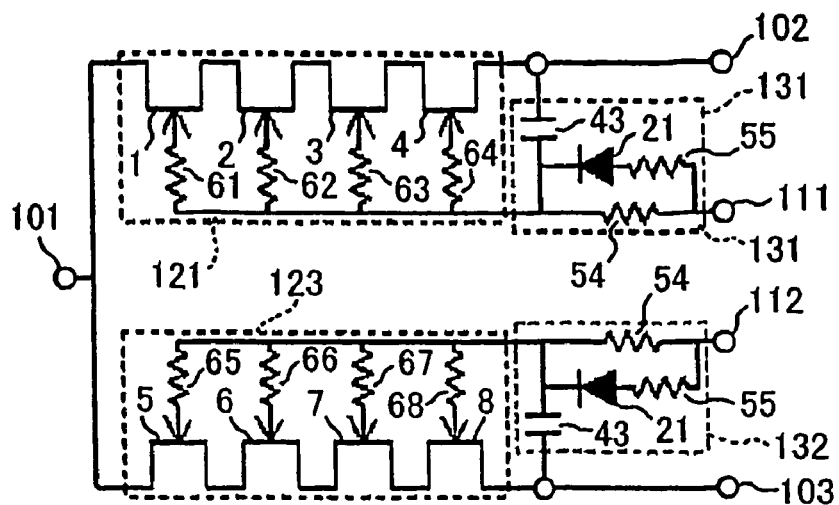
FIGS. 25 and 26 circuit diagrams showing specific circuit arrangements of the high-frequency switch circuit according to the fifth embodiment.
Figure 26:
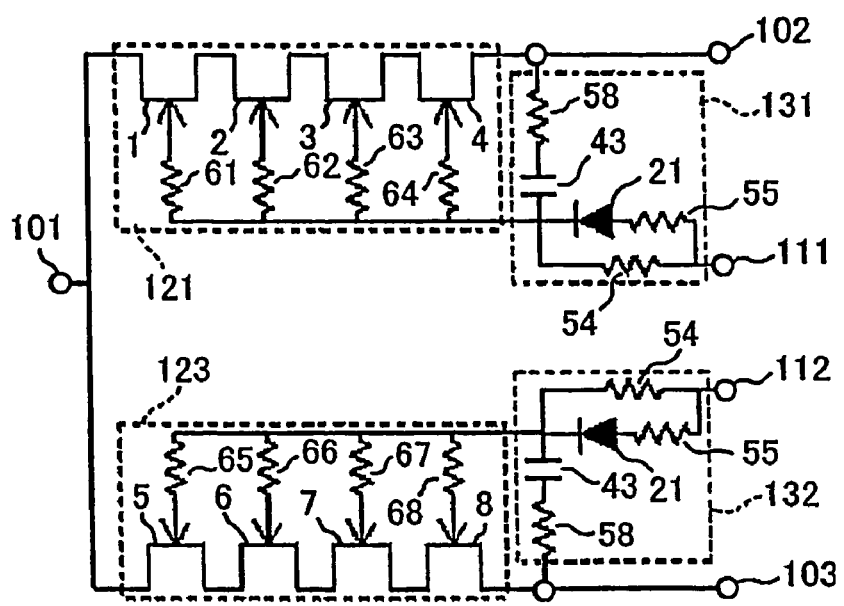

FIGS. 25 and 26 show specific circuit arrangements of the high-frequency switch circuit according to the fifth embodiment. The high-frequency switch circuit shown in FIG. 25 is equivalent to the high-frequency switch circuit shown in FIG. 23 except that the high-frequency detecting terminals of voltage boosting circuits 131, 132 are connected respectively to high-frequency terminals 102, 103. The high-frequency switch circuit shown in FIG. 26 is similar to the high-frequency switch circuit shown in FIG. 25 except that resistive element 58 is inserted between capacitive element 43 and the high-frequency detecting terminal of each of voltage boosting circuits 131, 132.

Operation of the high-frequency switch circuit according to the fifth embodiment will be described below.

Referring again to FIG. 24, control potentials having binary levels, i.e., high and low levels, are complementarily applied as control signals to control potential input terminals 111, 112. It is assumed that a high-level potential is applied to control potential input terminal 111 and a low-level potential is applied to control potential input terminal 112. When a high-frequency signal is input to high-frequency terminal 101 at this time, since high-frequency switch 121 is in an ON-state, the high-frequency signal is output to high-frequency terminal 102. Therefore, a signal having the same amplitude as the high-frequency input signal can be detected at high-frequency detecting terminal 211. Since high-frequency switch 123 is in an OFF-state, no signal is output to high-frequency terminal 103. As with the above embodiments, the amplitude of the signal at high-frequency terminal 102 connected to high-frequency switch 123 that is in an OFF-state is considered to be substantially zero, and the amplitude of the signal detected at high-frequency detecting terminal 212 is almost zero.

Voltage boosting circuits 131, 132 connected to high-frequency switches 121, 124 operate as follows: Since voltage boosting circuits 131, 132 operate in the same manner irrespective of which one of the circuits shown in FIGS. 12 to 15 is employed, it is assumed that voltage boosting circuit 131 shown in FIG. 12 is employed.

The high-frequency signal detected at high-frequency detecting terminal 212 of the high-frequency switch side is input to high-frequency detecting terminal 206 of voltage boosting circuit 131. The high-frequency signal is detected by diode 21, and a detected asymmetric current flows in from diode 21. As a result, a potential higher than the potential at input terminal 204 appears at output terminal 205 of voltage boosting circuit 131. Since the high-frequency signal detected by the high-frequency switch side is of the same magnitude as the high-frequency input signal when the high-frequency switch is in an ON-state and is substantially zero in amplitude when the high-frequency switch is in an OFF-state, the difference between the control potential input to the high-frequency switch in an ON-state and the control potential input to the high-frequency switch in an OFF-state increases as the input amplitude of the high-frequency signal increases. Consequently, $(V_H – V_L)$ in the equation (1) increases. Therefore, even if the control potentials input to control potential input terminals 111, 112 are low, this high-frequency switch circuit can have its handling power increased without having to increase the number of FETs connected in cascade.

A sixth embodiment of the present invention will be described below. In the second to fifth embodiments described above, the voltage boosting circuits are connected to all the high-frequency switches of the high-frequency switch circuit. According to the sixth embodiment, a voltage boosting circuit is connected to only certain high-frequency switches. This arrangement is effective in a high-frequency switch application where a high-amplitude signal is input to only a certain high-frequency terminal and a low-amplitude signal is input to another high-frequency terminal. In this case, the handling power of high-frequency switches through which the high-amplitude signal passes may be increased.

Figure 27:
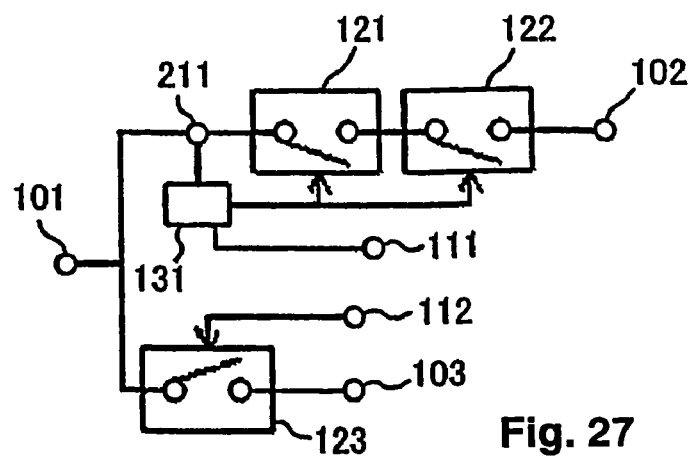
FIG. 27 is a block diagram showing a high-frequency switch circuit according to a sixth embodiment of the present invention.

FIG. 27 shows an example of the arrangement of such a high-frequency switch circuit. The switch circuit has high-frequency terminals 101 to 103, high-frequency switches 121 to 123, voltage boosting circuit 131, and control potential input terminals 111, 112. High-frequency switches 121, 122 are connected in cascade. High-frequency switch 122 has an output terminal connected to high-frequency terminal 102, and high-frequency switch 123 has an output terminal connected to high-frequency terminal 103. High-frequency switches 121, 123 have respective input terminals connected to high-frequency terminal 101 which serves as high-frequency detecting terminal 211. Voltage boosting circuit 131 has an input terminal connected to control potential input terminal 111 and a high-frequency detecting terminal connected to the input terminal of high-frequency switch 121, i.e., high-frequency detecting terminal 211.

Voltage boosting circuits 131, 132 may employ either one of the arrangements shown in FIGS. 12 to 15. High-frequency switches 121 to 123 may employ the arrangement shown in FIG. 16 or 17. Of course, the number of cascaded FETs in the high-frequency switches is not limited to those shown in FIGS. 16 and 17.

Operation of the sixth embodiment will be described below. The high-frequency switch circuit according to the sixth embodiment operates in the same principles as with the first embodiment described above. Only different operational features will be described below.

The high-frequency switch circuit according to the sixth embodiment is arranged such that a high-amplitude signal is input from only a certain high-frequency terminal, and the handling power of high-frequency switches through which the high-amplitude signal passes is increased. It is assumed that a high-amplitude signal is input to only high-frequency terminal 102, and high-frequency switches 121, 122 are turned on. Voltage boosting circuit 131 is connected to high-frequency switches 121, 122, and no voltage boosting circuit is connected to high-frequency switch 123. The amplitude of a signal at high-frequency detecting terminal 211 is essentially the same as the amplitude of a signal input to high-frequency terminal 102. Inasmuch as the voltage boosting circuit operates in the principles described above with respect to the first embodiment, a potential increased depending on the input amplitude of the high-frequency signal is applied to the control terminals of high-frequency switches 121, 122, and a potential applied to the control terminal of high-frequency switch 123 is not increased. Therefore, the difference between the control potential input to the high-frequency switch in an ON-state and the control potential input to the high-frequency switch in an OFF-state increases as the input amplitude of the high-frequency signal increases. Consequently, $(V_H-V_L)$ in the equation (1) increases. Therefore, even if the control potentials input to control potential input terminals 111, 112 are low, this high-frequency switch circuit can have its handling power increased without having to increase the number of FETs connected in cascade.

FIG. 28 shows a specific circuit arrangement of the high-frequency switch circuit according to the sixth embodiment. FETs 1, 2 connected in cascade and resistive elements 61, 62 connected to the respective gates of FETs 1, 2 make up high-frequency switch 121. Similarly, FETs 3, 4 and resistive elements 63, 64 make up high-frequency switch 122. FETs 5 to 8 and resistive elements 65 to 68 make up high-frequency switch 123. Voltage boosting circuit 131 employs the arrangement shown in FIG. 13.

In the above embodiment, the SPDT arrangement has basically been described. However, the circuit according to the present invention is not limited to the SPDT switch, but is also applicable to an SPnT or multiple-input, multiple-output switch. While the input terminal of a high-frequency switch is used as the high-frequency detecting terminal in the above embodiment, the cascade connection terminal of high-frequency switches or the output terminal of a high-frequency switch may be used as a high-frequency detecting terminal for the same advantages.

A seventh embodiment of the present invention will be described below. In the sixth embodiment described above, the control potential for the high-frequency switch to be turned on is increased by the voltage boosting circuit. In the seventh embodiment, in view of a high-amplitude signal input to a certain high-frequency terminal as with the sixth embodiment, a voltage lowering circuit is provided for lowering a control potential applied to high-frequency switches to be turned off in order to increase the handling power of certain high-frequency switches.

FIG. 29 shows an example of the arrangement of such a high-frequency switch circuit. The switch circuit has high-frequency terminals 101 to 103, high-frequency switches 121 to 124, a voltage lowering circuit 161, and control potential input terminals 111, 112. High-frequency switches 123, 124 are connected in cascade, and high frequency switches 121, 122 are connected in cascade. Cascaded high-frequency switch 122 has an output terminal connected to high-frequency terminal 102, and cascaded high-frequency switch 124 has an output terminal connected to high-frequency terminal 103. High-frequency switches 121, 123 have respective input terminals connected to high-frequency terminal 101 which serves as high-frequency detecting terminal 211. Voltage lowering circuit 161 has an input terminal connected to control potential input terminal 112 and a high-frequency detecting terminal connected to the input terminal of high-frequency switch 123, i.e., high-frequency detecting terminal 211.

Voltage lowering circuit 161 will be described below. The voltage lowering circuit may be a voltage boosting circuit described above where the polarity of the diode element is reversed.

FIG. 30 shows an example of the arrangement of voltage lowering circuit 161. Voltage lowering circuit 161 has input terminal 304 and output terminal 305 between which a resistive element 54 is connected, and diode 22 element is connected to resistive element 54 in parallel. Diode element 224 has an anode connected to output terminal 305 and a cathode connected to input terminal 304. Further, capacitive element 43 is connected between high-frequency detecting terminal 306 and output terminal 305 of voltage lowering circuit 161. As shown in FIG. 31, resistive element 55 may be inserted between input terminal 304 and the cathode of diode element 22. As shown in FIG. 32, resistive element 56 may be inserted between output terminal 305 and the anode of diode element 22. The voltage lowering circuits shown in FIGS. 30 to 32 are equivalent to the voltage boosting circuits shown in FIGS. 12 to 14, respectively, where the polarity of the diode element is reversed.

In the present embodiment, voltage lowering circuit 161 may employ either one of the arrangements shown in FIGS. 30 to 32. High-frequency switches 121 to 124 may employ the arrangement shown in FIG. 16 or 17. Of course, the number of cascaded FETs in the high-frequency switches is not limited to those shown in FIGS. 16 and 17.

Operation of the seventh embodiment will be described below.

FIG. 29 will be referred to again. According to the seventh embodiment, a high-amplitude signal is input from only a certain high-frequency terminal, and it is an object of the seventh embodiment to increase the handling power of high-frequency switches through which the high-amplitude signal passes. It is assumed that a high-amplitude signal is input to only high-frequency terminal 102, and high-frequency switches 121, 122 are turned on. Neither voltage boosting circuit nor voltage lowering circuit is connected to high-frequency switches 121, 122, and voltage lowering circuit 161 is connected to high-frequency switches 123, 124. Therefore, the amplitude of a signal at high-frequency detecting terminal 211 is essentially the same as the amplitude of a signal input to high-frequency terminal 102.

Inasmuch as voltage lowering circuit 161 operates in the same manner irrespective of which one of the circuits shown in FIGS. 30 to 32 is employed, it is assumed that voltage lower circuit 161 shown in FIG. 30 is employed.

The high-frequency signal detected at high-frequency detecting terminal 211 of the high-frequency switch side is input to high-frequency detecting terminal 306 of voltage lowering circuit 161. The high-frequency signal is detected by diode 22, and a detected asymmetric current flows in from diode 21. As a result, a potential lower than the potential at input terminal 304 appears at lowered potential terminal 307 of voltage lowering circuit 161.

Therefore, the potential at the control terminals of high-frequency switches 123, 124 is lowered from the potential at control potential input terminal 112 by voltage lowering circuit 161. Since the potential at the control terminals of high-frequency switches 121, 122 remains unchanged, it is the same as the potential at control potential input terminal 111. Consequently, the difference between the control potential input to the high-frequency switch in an ON-state and the control potential input to the high-frequency switch in an OFF-state increases as the input amplitude of the high-frequency signal increases. Consequently, $(V_H-V_L)$ in the equation (1) increases. Therefore, even if the control potentials input to control potential input terminals 111, 112 are low, the present high-frequency switch circuit can have its handling power increased, without having to increase the number of FETs connected in cascade.

Figure 33:
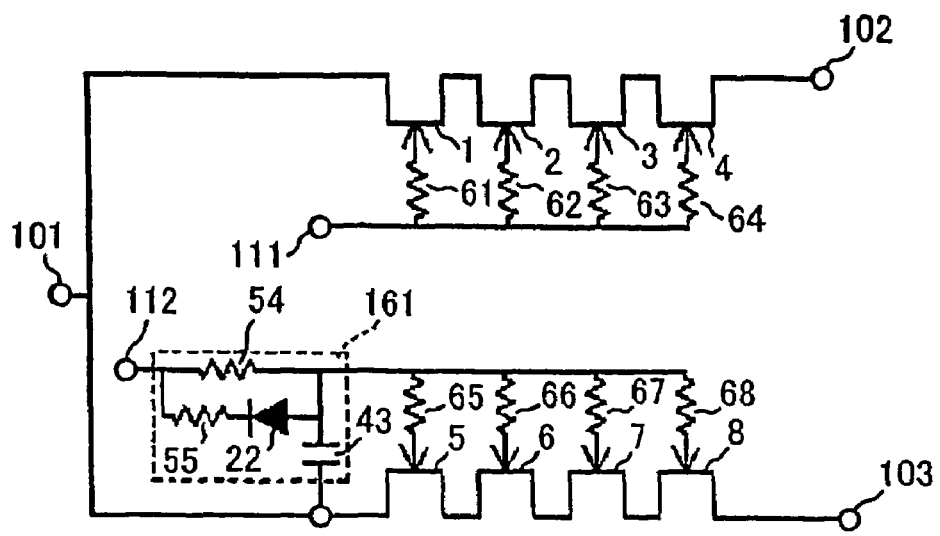
FIG. 33 is a circuit diagram showing a specific circuit arrangement of the high-frequency switch circuit according to the seventh embodiment.

FIG. 33 shows a specific circuit arrangement of the high-frequency switch circuit according to the sixth embodiment. FETs 1, 2 connected in cascade and resistive elements 61, 62 connected to the respective gates of FETs 1, 2 make up high-frequency switch 121. Similarly, FETs 3, 4 and resistive elements 63, 64 make up high-frequency switch 122. FETs 5, 6 and resistive elements 65, 66 make up high-frequency switch 123, and FETs 7, 8 and resistive elements 67, 68 make up high-frequency switch 124. Voltage lowering circuit 161 employs the arrangement shown in FIG. 31.

In the above embodiment, the SPDT arrangement has basically been described. However, the circuit according to the present invention is not limited to the SPDT switch, but is also applicable to an SPnT or multiple-input, multiple-output switch. While the input terminal of a high-frequency switch is used as the high-frequency detecting terminal in the above embodiment, the cascade connection terminal of high-frequency switches or the output terminal of a high-frequency switch may be used as a high-frequency detecting terminal for the same advantages.

An eighth embodiment of the present invention will be described below. In the seventh embodiment described above, a high-frequency terminal to which a high-amplitude signal is input is a particular terminal. A high-frequency switch circuit according to the eighth embodiment is of an arrangement capable of lowering a potential at a high-frequency switch in an OFF-state for achieving high handling power irrespective of which high-frequency terminal is supplied with a high-amplitude signal. Specifically, the high-frequency switch circuit according to the eighth embodiment has voltage boosting circuits and voltage lowering circuits as described above, and potential combining circuits for combining potentials from the voltage increasing and lowering circuits and outputting the combined potentials.

Figure 34:
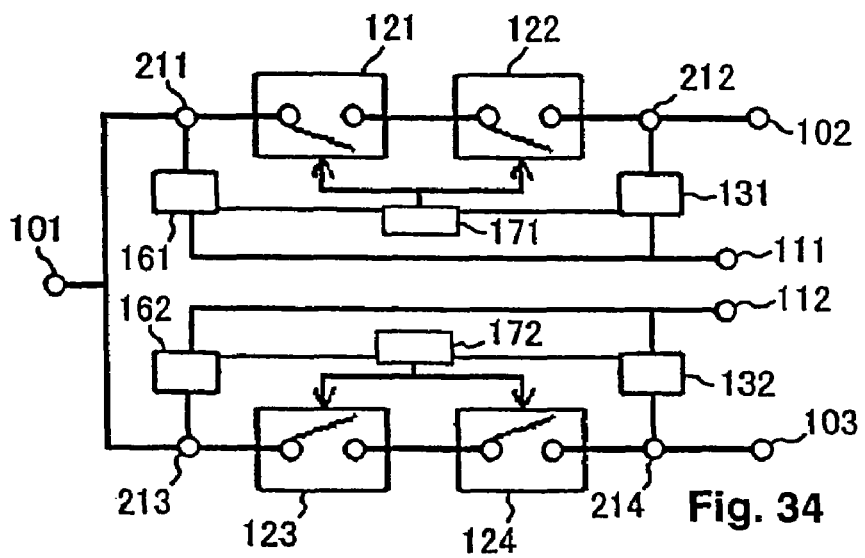
FIG. 34 is a block diagram showing a high-frequency switch circuit according to an eighth embodiment of the present invention.

FIG. 34 shows an example of the arrangement of such a high-frequency switch circuit. The switch circuit has high-frequency terminals 101 to 103, high-frequency switches 121 to 124, voltage boosting circuits 131, 132, voltage lowering circuits 161, 162, control potential input terminals 111, 112, and potential combining circuits 171, 172. High-frequency switch 122 has an output terminal connected to high-frequency terminal 102 which serves as detecting terminal 212, and an input terminal connected to the output terminal of high-frequency switch 121. High-frequency switch 124 has an output terminal connected to high-frequency terminal 103 which serves as high-frequency detecting terminal 214, and an input terminal connected to the output terminal of high-frequency switch 123. High-frequency switches 121, 123 have respective input terminals connected to high-frequency terminal 101 which serves as high-frequency detecting terminals 211, 213.

Voltage boosting circuit 131 and voltage lowering circuit 161 have respective input terminals connected to control potential input terminal 111. Voltage boosting circuit 131 has an output terminal connected to a first input terminal of potential combining circuit 171, and voltage lowering circuit 161 has an output terminal connected to a second input terminal of potential combining circuit 171. The output terminal of the potential combining circuit is connected to the control terminals of high-frequency switches 121, 122. Voltage boosting circuit 131 has a high-frequency detecting terminal connected to the output terminal of high-frequency switch 122, i.e., detecting terminal 212. Voltage lowering circuit 161 has a high-frequency detecting terminal connected to the input terminal of high-frequency switch 121, i.e., detecting terminal 211.

Further, voltage boosting circuit 132 and voltage lowering circuit 162 have respective input terminals connected to control potential input terminal 112. Voltage boosting circuit 132 has an output terminal connected to a first input terminal of potential combining circuit 172, and voltage lowering circuit 162 has an output terminal connected to a second input terminal of potential combining circuit 172. The output terminal of the potential combing circuit is connected to the control terminals of high-frequency switches 123, 124. Voltage boosting circuit 132 has a high-frequency detecting terminal connected to the output terminal of high-frequency switch 124, i.e., detecting terminal 214. Voltage lowering circuit 162 has a high-frequency detecting terminal connected to the input terminal of high-frequency switch 123, i.e., detecting terminal 213.

Voltage boosting circuits 131, 132 may employ either one of the arrangements shown in FIGS. 12 to 15. Voltage lowering circuits 161, 162 may employ either one of the arrangements shown in FIGS. 30 to 32. High-frequency switches 121 to 124 may employ the arrangement shown in FIG. 16 or 17. Of course, the number of cascaded FETs in the high-frequency switches is not limited to those shown in FIGS. 16 and 17.

Figure 35:
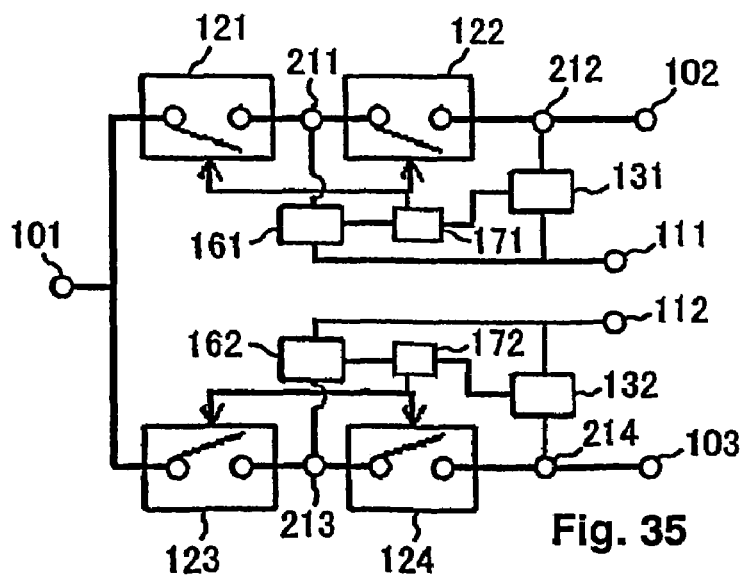
FIG. 35 is a block diagram showing another arrangement of the high-frequency switch circuit according to the eighth embodiment.

FIG. 35 shows another example of the arrangement of the high-frequency switch circuit according to the sixth embodiment. The high-frequency switch circuit has high-frequency terminals 101 to 103, high-frequency switches 121 to 124, voltage boosting circuits 131, 132, voltage lowering circuits 161, 162, control potential input terminals 111, 112, and potential combining circuits 171, 172. High-frequency switch 122 has an output terminal connected to high-frequency terminal 102 which serves as high-frequency detecting terminal 212, and an input terminal connected to the output terminal of high-frequency switch 121, the junction between high-frequency switches 121, 122 serving as high-frequency detecting terminal 211. High-frequency switch 124 has an output terminal connected to high-frequency terminal 103 which serves as detecting terminal 214, and an input terminal connected to the output terminal of high-frequency switch 123, the junction between high-frequency switches 123, 124 serving as high-frequency detecting terminal 213. High-frequency switches 121, 123 have respective input terminals connected to high-frequency terminal 101.

Voltage boosting circuit 131 and voltage lowering circuit 161 have respective input terminals connected to control potential input terminal 111. Voltage boosting circuit 131 has an output terminal connected to a first input terminal of potential combining circuit 171, and voltage lowering circuit 161 has an output terminal connected to a second input terminal of potential combining circuit 171. The output terminal of the potential combining circuit is connected to the control terminals of high-frequency switches 121, 122. Voltage boosting circuit 131 has a high-frequency detecting terminal connected to the output terminal of high-frequency switch 122, i.e., detecting terminal 212. Voltage lowering circuit 161 has a high-frequency detecting terminal connected to detecting terminal 211.

Voltage boosting circuit 132 and voltage lowering circuit 162 have respective input terminals connected to control potential input terminal 112. Voltage boosting circuit 132 has an output terminal connected to a first input terminal of potential combining circuit 172, and voltage lowering circuit 162 has an output terminal connected to a second input terminal of potential combining circuit 172. The output terminal of the potential combining circuit is connected to the control terminals of high-frequency switches 123, 124. Voltage boosting circuit 132 has a high-frequency detecting terminal connected to the output terminal of high-frequency switch 124, i.e., detecting terminal 214. Voltage lowering circuit 162 has a high-frequency detecting terminal connected to detecting terminal 213.

Voltage boosting circuits 131, 132 may employ either one of the arrangements shown in FIGS. 12 to 15. Voltage lowering circuits 161, 162 may employ either one of the arrangements shown in FIGS. 30 to 32. High-frequency switches 121 to 124 may employ the arrangement shown in FIG. 16 or 17. Of course, the number of cascaded FETs in the high-frequency switches is not limited to those shown in FIGS. 16 and 17.

Potential combining circuits 171, 172 according to the present embodiment will be described below. Since potential combining circuits 171, 172 are usually identical in circuit arrangement, potential combining circuit 171 will be described below.

Figure 36:
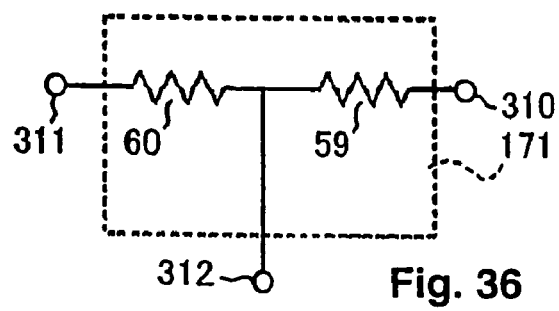
FIG. 36 is a circuit diagram showing a specific example of a potential combining circuit.

FIG. 36 shows an example of the arrangement of potential combining circuit 171. Potential combining circuit 171 has first and second input terminals 310, 311 and output terminal 312, resistive element 59 connected between first input terminal 310 and output terminal 312, and resistive element 60 connected between second input terminal 311 and output terminal 312. Potential combining circuit 171 is not limited to the arrangement shown in FIG. 36 insofar as the potential between the potential at first input terminal 310 and the potential at second input terminal 311 is output to output terminal 312.

In the above circuit, the high-frequency detecting terminal of a voltage lowering circuit is connected to the junction between high-frequency switches. According to the present embodiment, unless the high-frequency detecting terminal of a voltage lowering circuit and the high-frequency detecting terminal of a voltage boosting circuit associated with certain high-frequency switches are connected to one point, a difference is developed between input signals applied to the voltage boosting circuit and the voltage lowering circuit, making it possible to change an increase or decrease amount in the potentials at the control terminals by on-and-off operation of the switch elements. Unless being connected to one point, the high-frequency detecting terminals of the voltage boosting circuit and the voltage lowering circuit may be connected to the junctions between the high-frequency switches or the input and output terminals of the switch means, and are not limited to the illustrated arrangement.

Operation of the high-frequency switch circuit according to the sixth embodiment will be described below.

Referring again to FIG. 34, control potentials having binary levels, i.e., high and low levels, are complementarily applied as control signals to control potential input terminals 111, 112. It is assumed that a high-level potential is applied to control potential input terminal 111 and a low-level potential is applied to control potential input terminal 112. When a high-frequency signal is input to high-frequency terminal 101 at this time, since high-frequency switches 121, 122 are in an ON-state, the signal is output to high-frequency terminal 102. Therefore, a signal having the same amplitude as the high-frequency input signal can be detected at high-frequency detecting terminals 211, 212. On the other hand, since high-frequency switches 123, 124 are in an OFF-state, no signal is output to high-frequency terminal 103. In an ordinary usage mode, as high-frequency terminals 101 to 103 are terminated, the amplitude of the signal at high-frequency terminal 102 connected to high-frequency switches 123, 124 that is in an OFF-state is considered to be at substantially ground potential. Therefore, a signal having the same amplitude as the input signal is detected at high-frequency detecting terminal 213, and no signal is detected at high-frequency detecting terminal 214.

Voltage lowering circuit 161 and voltage boosting circuit 131 that are connected respectively to high-frequency detecting terminals 211, 212 operate as follows: Since voltage boosting circuits 131, 132 operate in the same manner irrespective of which one of the circuits shown in FIGS. 12 to 15 is employed, it is assumed that voltage boosting circuit 131 shown in FIG. 12 is employed. Since voltage lowering circuits 161, 162 operate in the same manner irrespective of which one of the circuits shown in FIGS. 30 to 32 is employed, it is assumed that voltage lowering circuit 161 shown in FIG. 30 is employed.

The high-frequency signal detected at high-frequency detecting terminal 212 of the high-frequency switch side is input to high-frequency detecting terminal 206 of voltage boosting circuit 131. This high-frequency signal is detected by diode 21, and a detected asymmetric current flows in from diode 21. As a result, a potential higher than the potential at input terminal 204 appears at increased voltage output terminal 205 of voltage boosting circuit 131. Furthermore, the high-frequency signal detected at high-frequency detecting terminal 211 of the high-frequency switch side is input to high-frequency detecting terminal 306 of voltage lowering circuit 161. This high-frequency signal is detected by diode 21, and a detected asymmetric current flows out from diode 21. As a result, a potential lower than the potential at input terminal 304 appears at decreased voltage output terminal 305 of voltage lowering circuit 161.

The potential combining circuit averages the output potentials of voltage boosting circuit 131 and voltage lowering circuit 161. The high-frequency signals detected respectively at high-frequency detecting terminals 211, 212 are of substantially the same amplitude when high-frequency switches 121, 122 are in an ON-state. Therefore, an increase caused in the potential by the voltage boosting circuit and a reduction caused in the potential by the voltage lowering circuit are of substantially the same value, and the potentials applied to the control terminals of high-frequency switches 121, 122 are essentially the same as the high-level potential applied to control potential input terminal 111.

Control potentials applied to high-frequency switches 123, 124 are determined in the same manner as the control potentials applied to high-frequency switches 121, 122. However, since the amplitude of the signal at high-frequency detecting terminal 213 of voltage lowering circuit 162 is equal to the amplitude of the input signal, and the amplitude of the signal at high-frequency detecting terminal 214 of voltage boosting circuit 132 is substantially zero, the voltage lowering circuit reduces the potential, but the voltage boosting circuit does not increase the potential. As a result, the output of the potential combining circuit becomes lower than the low-level potential applied to control potential input terminal 112.

As a consequence, the difference between the control potential input to high-frequency switches 121, 122 in an ON-state and the control potential input to high-frequency switches 123, 124 in an OFF-state increases as the input amplitude of the high-frequency signal increases. Consequently, $(V_H-V_L)$ in the equation (1) increases. Therefore, even if the control potentials input to control potential input terminals 111, 112 are low, this high-frequency switch circuit can have its handling power increased without having to increase the number of FETs connected in cascade.

Figure 37:
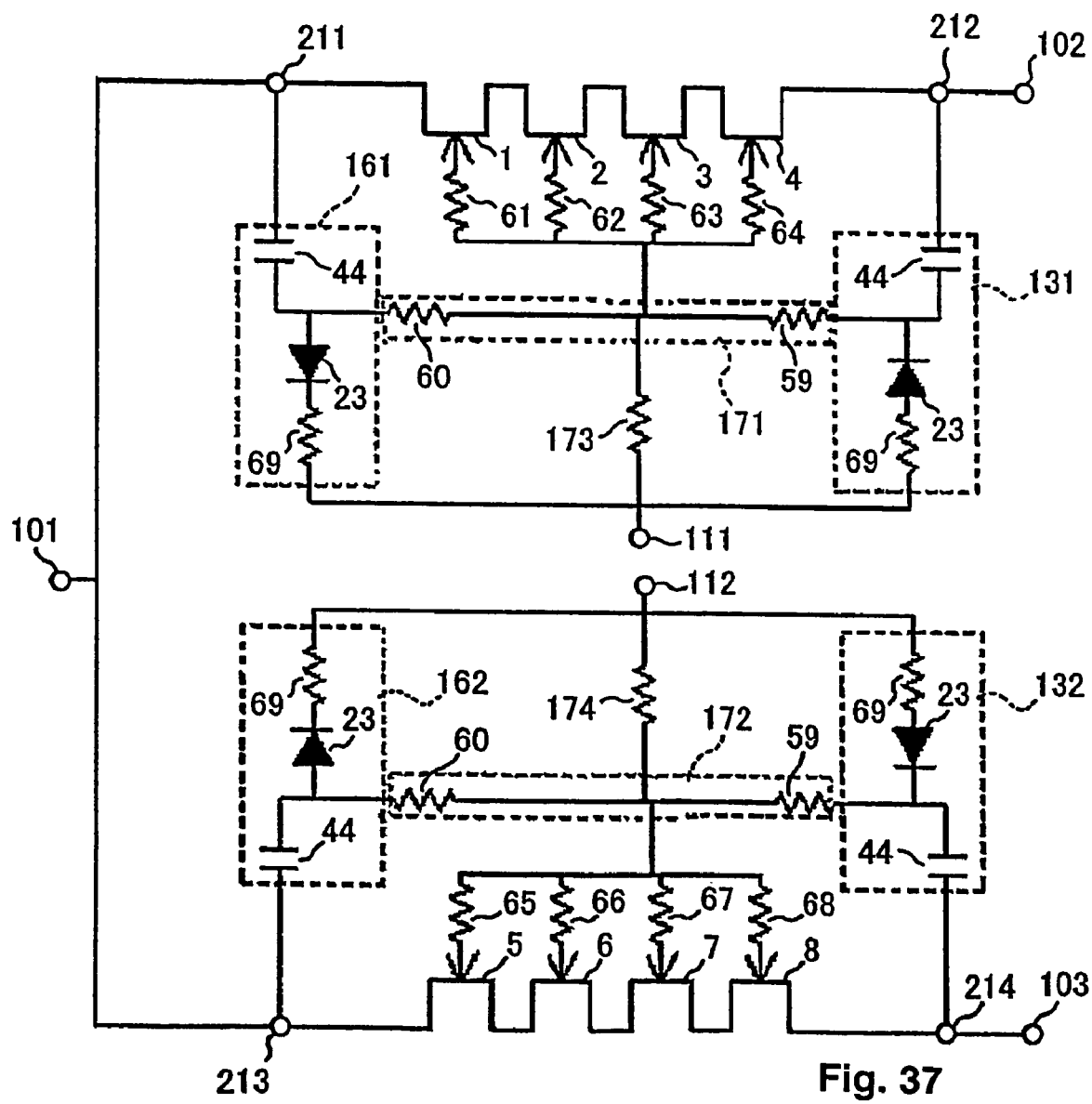
FIGS. 37 and 38 are circuit diagrams showing specific circuit arrangements of the high-frequency switch circuit according to the eighth embodiment.
Figure 38:
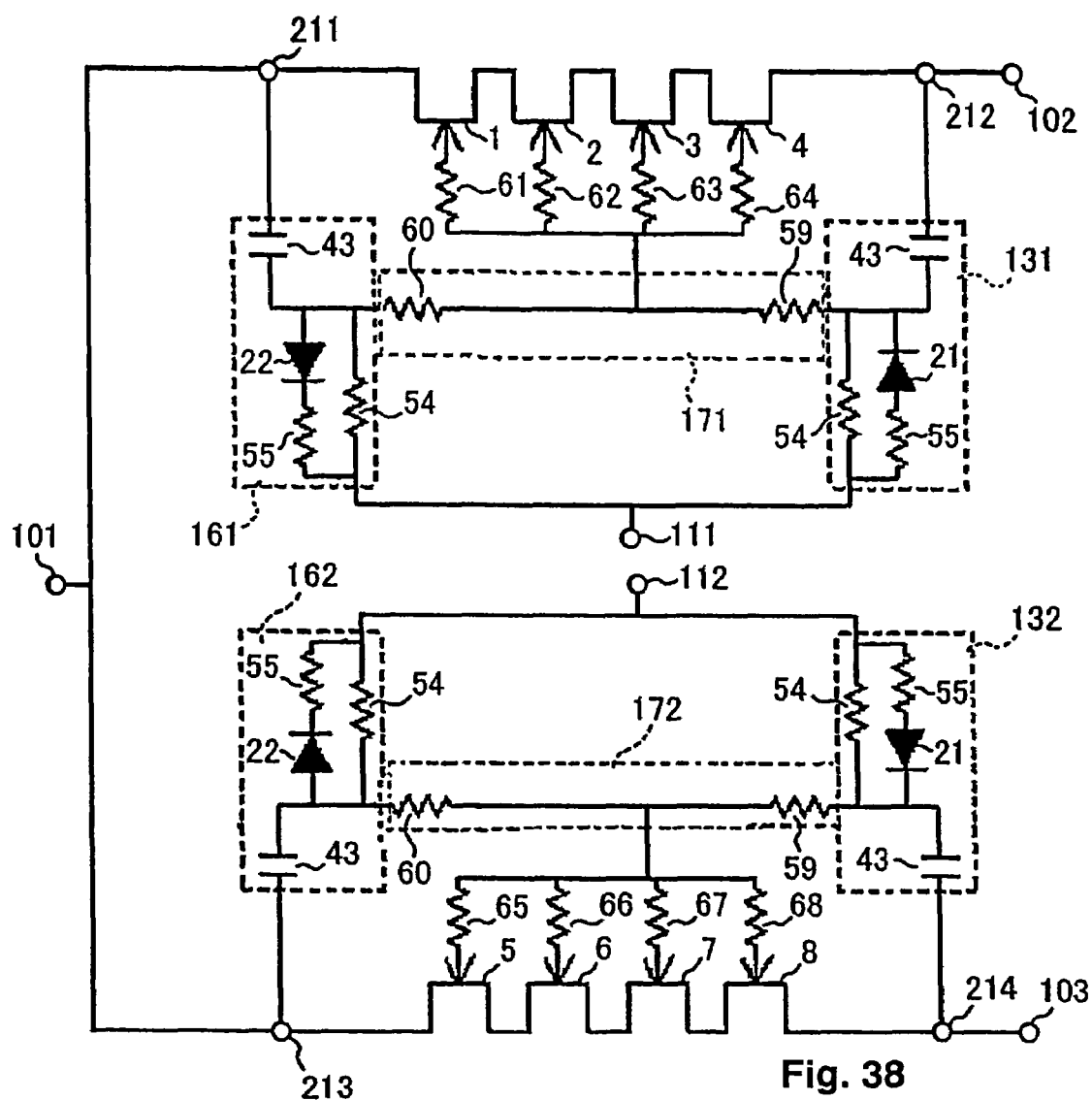

FIGS. 37 and 38 show specific circuit arrangements of the high-frequency switch circuit according to the sixth embodiment. In these circuits, FETs 1, 2 connected in cascade and resistive elements 61, 62 connected to the respective gates of FETs 1, 2 make up high-frequency switch 121. Similarly, FETs 3, 4 and resistive elements 63, 64 make up high-frequency switch 122. FETs 5, 6 and resistive elements 65, 66 make up high-frequency switch 123, and FETs 7, 8 and resistive elements 67, 68 make up high-frequency switch 124.

In the circuit shown in FIG. 37, each of voltage boosting circuits 131, 132 has resistive element 69 having one end connected to an input terminal and the other end connected to the anode of diode element 23, an output terminal connected to the cathode of diode element 23, and capacitive element 44 connected between the output terminal and a high-frequency detecting terminal. Voltage lowering circuits 161, 162 are equivalent to voltage boosting circuits 131, 132, respectively, where the polarity of diode elements 23 is reversed. In the circuit shown in FIG. 37, resistor 173 is inserted between control potential input terminal 111 and the output terminal of potential combining circuit 171, and similarly resistor 174 is inserted between control potential input terminal 112 and the output terminal of potential combining circuit 172.

In the circuit shown in FIG. 38, each of the voltage boosting circuits employs the arrangement shown in FIG. 13 and each of the voltage lowering circuits employs the arrangement shown in FIG. 31.

In the above embodiment, the SPDT arrangement has basically been described. However, the circuit according to the present invention is not limited to the SPDT switch, but is also applicable to an SPnT or multiple-input, multiple-output switch. The voltage boosting circuits and the voltage lowering circuits in the above high-frequency switch circuit are identical in circuit arrangement except that the polarity of the diode element is reversed, and this arrangement offers the above advantages. However, in the high-frequency switch circuit, the circuit arrangements of the voltage boosting circuits and the voltage lowering circuits and the element values making up these circuits do not need to be identical. If a circuit arrangement is employed for making an increase caused in the potential by the voltage boosting circuits greater than a reduction caused in the potential by the voltage lowering circuits, then it is possible to increase the potential at the control terminal of the high-frequency switch in an ON-state and lower the potential at the control terminal of the high-frequency switch in an OFF-state. In this case, too, the handling power is increased.

A ninth embodiment of the present invention will be described below. In view of a high-amplitude signal input to a certain high-frequency terminal as with the sixth embodiment, the control potential for high-frequency switches to be turned off is lowered in order to increase the handling power of certain high-frequency switches.

Figure 39:
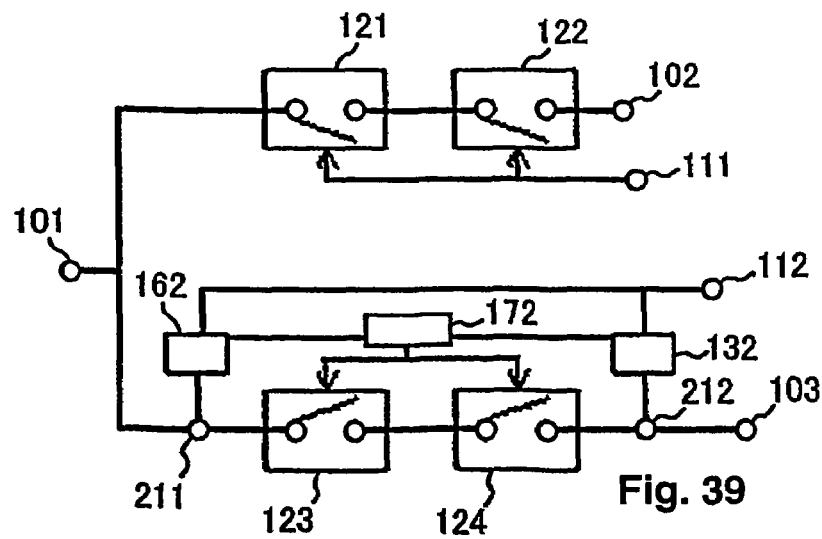
FIG. 39 is a block diagram showing a high-frequency switch circuit according to a ninth embodiment of the present invention.

FIG. 39 shows an example of the arrangement of such a high-frequency switch circuit. The high-frequency switch circuit has high-frequency terminals 101 to 103, high-frequency switches 121 to 124, voltage boosting circuit 132, voltage lowering circuit 162, control potential input terminals 111, 112, and potential combining circuit 172. High-frequency switch 122 has an output terminal connected to high-frequency terminal 102 and an input terminal connected to the output terminal of high-frequency switch 121. High-frequency switch 124 has an output terminal connected to high-frequency terminal 103 which serves as high-frequency detecting terminal 212, and an input terminal connected to the output terminal of high-frequency switch 123. The input terminals of high-frequency switches 121, 123 are connected to high-frequency terminal 101 which serves as high-frequency detecting terminal 211.

Voltage boosting circuit 132 and voltage lowering circuit 162 have respective input terminals connected to control potential input terminal 112. Voltage boosting circuit 132 has an output terminal connected to a first input terminal of potential combining circuit 172, and voltage lowering circuit 162 has an output terminal connected to a second input terminal of potential combining circuit 172. The output terminal of the potential combining circuit is connected to the control terminals of high-frequency switches 123, 124. Voltage boosting circuit 132 has a high-frequency detecting terminal connected to the output terminal of high-frequency switch 124, i.e., high-frequency detecting terminal 212. Voltage lowering circuit 162 has a high-frequency detecting terminal connected to the input terminal of high-frequency switch 123, i.e., high-frequency detecting terminal 211.

Voltage boosting circuit 132 may employ either one of the arrangements shown in FIGS. 12 to 15. Voltage lowering circuit 162 may employ either one of the arrangements shown in FIGS. 30 to 32. High-frequency switches 121 to 124 may employ the arrangement shown in FIG. 16 or 17. Of course, the number of cascaded FETs in the high-frequency switches is not limited to those shown in FIGS. 16 and 17. Potential combining circuit 172 may employ the arrangement shown in FIG. 36. Potential combining circuit 172 is not limited to the arrangement shown in FIG. 36 insofar as the potential between the potential at the first input terminal and the potential at the second input terminal is output to the output terminal.

Operation of the high-frequency switch circuit according to the ninth embodiment will be described below.

The high-frequency switch circuit according to the ninth embodiment is arranged such that a high-amplitude signal is input from only a certain high-frequency terminal, and the handling power of high-frequency switches through which the high-amplitude signal passes is increased. It is assumed that a high-amplitude signal is input to only high-frequency terminal 102, and high-frequency switches 121, 122 are turned on. Inasmuch as a circuit portion made up of high-frequency switches 123, 124, voltage boosting circuit 132, and voltage lowering circuit 162 operates in the principles described above with respect to the eighth embodiment, the potential at the control terminals of high-frequency switches 123, 124 is lowered from the potential at control potential input terminal 112 by a value corresponding to the amplitude of the signal. Since the potential at the control terminals of high-frequency switches 121, 122 remains unchanged, it is the same as the potential at control potential input terminal 111. Consequently, the difference between the control potential input to the high-frequency switch in an ON-state and the control potential input to the high-frequency switch in an OFF-state increases as the input amplitude of the high-frequency signal increases. Consequently, ($V_H$–$V_L$) in the equation (1) increases. Therefore, even if the control potentials input to control potential input terminals 111, 112 are low, this high-frequency switch circuit can have its handling power increased without having to increase the number of FETs connected in cascade.

Figure 40:
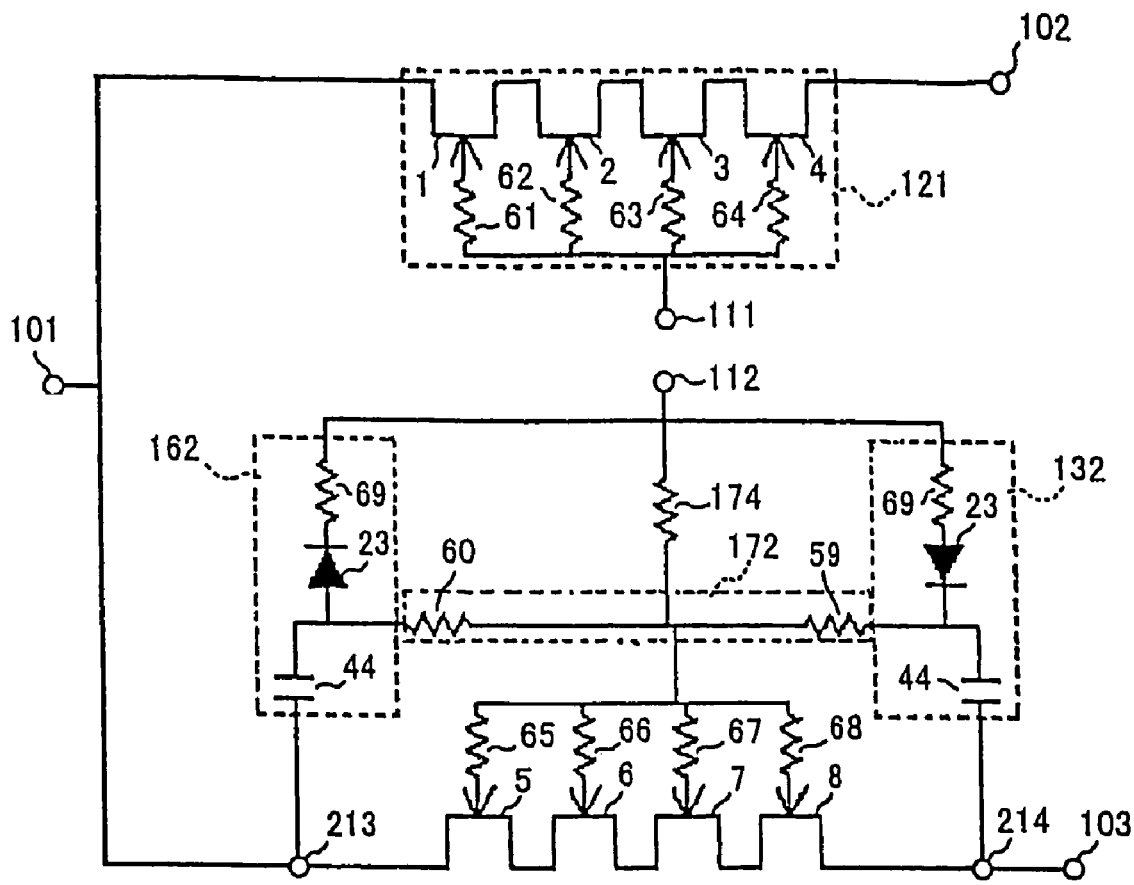
FIG. 40 is a circuit diagram showing a specific circuit arrangement of the high-frequency switch circuit according to the ninth embodiment.

FIG. 40 shows a specific circuit arrangement of the high-frequency switch circuit according to the ninth embodiment. FETs 1, 2 connected in cascade and resistive elements 61, 62 connected to the respective gates of FETs 1, 2 make up high-frequency switch 121. Similarly, FETs 3, 4 and resistive elements 63, 64 make up high-frequency switch 122. FETs 5, 6 and resistive elements 65, 66 make up high-frequency switch 123, and FETs 7, 8 and resistive elements 67, 68 make up high-frequency switch 124. The voltage boosting circuit and the voltage lowering circuit employ those in the high-frequency switch circuit shown in FIG. 37. Potential combining circuit 172 employs the arrangement shown in FIG. 36. Resistor 174 is inserted between control potential input terminal 112 and the output terminal of potential combining circuit 172.

In the above embodiment, the SPDT arrangement has basically been described. However, the circuit according to the present invention is not limited to the SPDT switch, but is also applicable to an SPnT or multiple-input, multiple-output switch. While the high-frequency detecting terminals are the input and output terminals of the high-frequency switches in the above embodiment, the cascade connection terminal of high-frequency switches or the output terminal of a high-frequency switch may be used as a high-frequency detecting terminal for the same advantages.

A tenth embodiment of the present invention will be described below. In the eighth and ninth embodiments described above, the high-frequency detecting terminals of the voltage boosting circuit and the voltage lowering circuit are the input and output terminals of the high-frequency switches or the junction terminal between cascaded switches. According to the tenth embodiment, potential dividing elements are connected in cascade between any two points of the input and output terminals of high-frequency switches and the junction terminal between cascaded switches as with the case of the first embodiment, and the junctions between the cascaded potential dividing elements are used as high-frequency detecting terminals.

Figure 41:
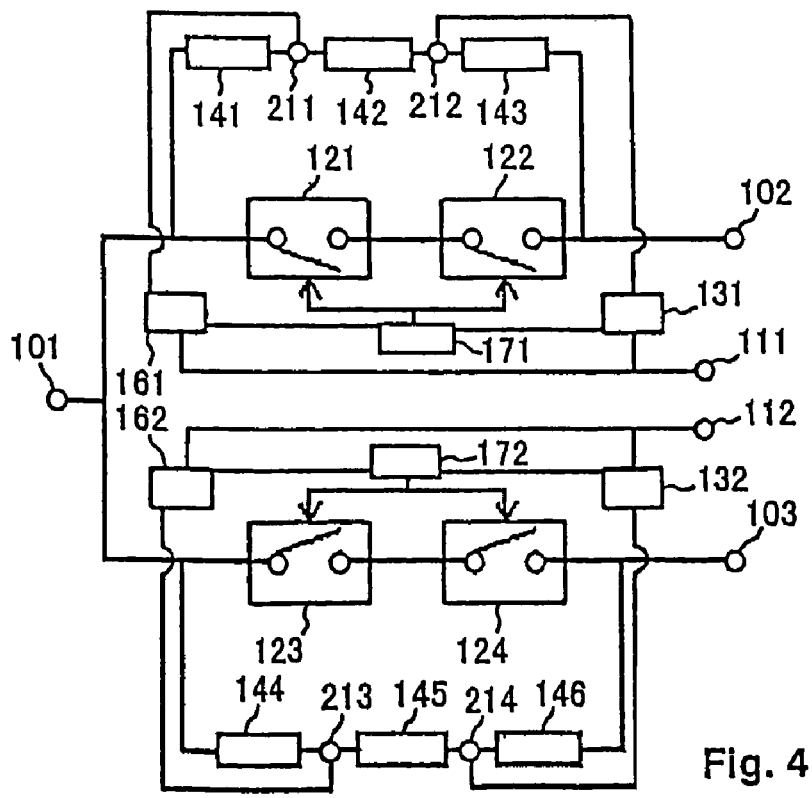
FIG. 41 is a block diagram showing a high-frequency switch circuit according to a tenth embodiment of the present invention.

FIG. 41 shows an example of the arrangement of such a high-frequency switch circuit. The high-frequency switch circuit has high-frequency terminals 101 to 103, high-frequency switches 121 to 124, voltage boosting circuits 131, 132, voltage lowering circuits 161, 162, control potential input terminals 111, 112, and potential combining circuits 171, 172. High-frequency switch 122 has an output terminal connected to high-frequency terminal 102, high-frequency switch 121 has an output terminal connected to the input terminal of high-frequency terminal 122, high-frequency switch 124 has an output terminal connected to high-frequency terminal 103, and high-frequency switch 123 has an output terminal connected to the input terminal of high-frequency switch 124. High-frequency switches 121, 123 have respective input terminals connected to high-frequency terminal 101. Cascaded potential dividing elements 141 to 143 are connected between high-frequency terminals 101, 102, and the two junctions between cascaded potential dividing elements 141 to 143 serve as high-frequency detecting terminals 211, 212. Cascaded potential dividing elements 144 to 146 are connected between high-frequency terminals 101, 103, and the two junctions between cascaded potential dividing elements 144 to 146 serve as high-frequency detecting terminals 213, 214.

Voltage boosting circuit 131 and voltage lowering circuit 161 have respective input terminals connected to control potential input terminal 111. Voltage boosting circuit 131 has an output terminal connected to a first input terminal of potential combining circuit 171, and voltage lowering circuit 161 has an output terminal connected to a second input terminal of potential combining circuit 171. The output terminal of the potential combining circuit is connected to the control terminals of high-frequency switches 121, 122. Voltage boosting circuit 131 has a high-frequency detecting terminal connected to high-frequency detecting terminal 212. Voltage lowering circuit 161 has a high-frequency detecting terminal connected to high-frequency detecting terminal 211. Voltage boosting circuit 132 and voltage lowering circuit 162 have respective input terminals connected to control potential input terminal 112. Voltage boosting circuit 132 has an output terminal connected to a first input terminal of potential combining circuit 172, and voltage lowering circuit 162 has an output terminal connected to a second input terminal of potential combining circuit 172. The output terminal of the potential combining circuit is connected to the control terminals of high-frequency switches 123, 124. Voltage boosting circuit 132 has a high-frequency detecting terminal connected to high-frequency detecting terminal 214. Voltage lowering circuit 162 has a high-frequency detecting terminal connected to high-frequency detecting terminal 213.

Voltage boosting circuits 131, 132 may employ either one of the arrangements shown in FIGS. 12 to 15. Voltage lowering circuits 161, 162 may employ either one of the arrangements shown in FIGS. 30 to 32. High-frequency switches 121 to 124 may employ the arrangement shown in FIG. 16 or 17. The number of cascaded FETs in the high-frequency switches is not limited to those shown in FIGS. 16 and 17. Potential combining circuits 171, 172 may employ arrangements other than the arrangement shown in FIG. 36 insofar as the potential between the potential at the first input terminal and the potential at the second input terminal is output to the output terminal. Potential dividing elements 141 to 146 may be any of resistive elements, capacitive elements, and inductive elements. Resistive elements, capacitive elements, and inductive elements may be connected either in series or parallel to each other as Potential dividing elements 141 to 146.

Operation of the high-frequency switch circuit according to the tenth embodiment will be described below. Operation of the tenth embodiment is described by way of the inputting of signals from the detecting terminals described above in the first embodiment and the operation of the voltage boosting circuits and the voltage lowering circuits described above in the eighth embodiment.

FIG. 41 will be referred to again. It is assumed that a high-level potential is input to control potential input terminal 111 and a low-level potential is input to control potential input terminal 112. When a high-frequency signal is input to high-frequency terminal 102 at this time, since high-frequency switches 121, 122 are in an ON-state, the signal is output to high-frequency terminal 102. Therefore, a signal having the same amplitude as the high-frequency input signal can be detected at high-frequency detecting terminals 211, 212. On the other hand, since high-frequency switches 123, 124 are in an OFF-state, if the input amplitude is represented by $V_{ampIN}$, amplitude $V_{amp213}$ at high-frequency detecting terminal 214 and amplitude $V_{amp214}$ at high-frequency detecting terminal 214 are related by $V_{ampIN} > V_{amp213} > V_{amp214} > 0$.

Voltage lowering circuit 161 and voltage boosting circuit 131 that are connected respectively to high-frequency detecting terminals 211, 212 detect an amplitude which is substantially the same as the amplitude input to high-frequency terminal 102, the output potentials from voltage boosting circuit 131 and voltage lowering circuit 161 cancel each other and the output of potential combining circuit 171 becomes the potential at control potential input terminal 111, as described above with respect to the eighth embodiment.

With respect to voltage lowering circuit 162 and voltage boosting circuit 132 that are connected respectively to high-frequency detecting terminals 213, 214, since the amplitude input to the detecting terminal of the voltage lowering circuit is greater than the amplitude input to the detecting terminal of the voltage boosting circuit because of the relation of the input amplitude, $V_{amp213} > V_{amp214}$, the potential difference that is lowered from the potential at the control potential input terminal by voltage lowering circuit 162 is greater than the potential difference that is increased from the potential at the control potential input terminal by voltage boosting circuit 132. As a result, the potential at the control terminals of high-frequency switches 123, 124 becomes lower than the potential at control potential input terminal 112. Therefore, the difference between the control potential input to the high-frequency switch in an ON-state and the control potential input to the high-frequency switch in an OFF-state increases as the input amplitude of the high-frequency signal increases. Consequently, $(V_H - V_L)$ in the equation (1) increases. Therefore, even if the control potentials input to control potential input terminals 111, 112 are low, the present high-frequency switch circuit can have its handling power increased without having to increase the number of FETs connected in cascade.

Figure 42:
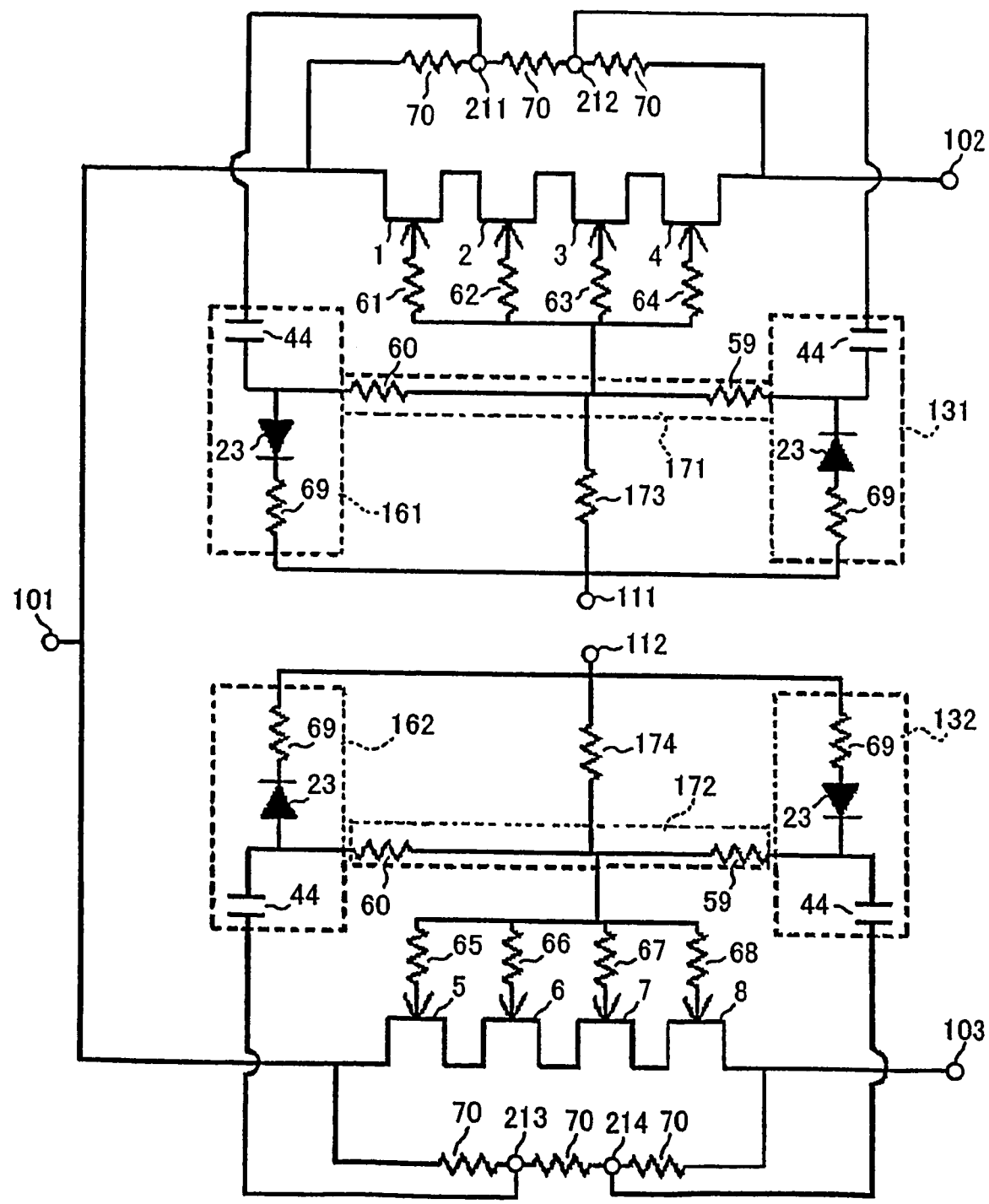
FIG. 42 is a circuit diagram showing a specific circuit arrangement of the high-frequency switch circuit according to the tenth embodiment.

FIG. 42 shows a specific circuit arrangement of the high-frequency switch circuit according to the tenth embodiment. FETs 1, 2 connected in cascade and resistive elements 61, 62 connected to the respective gates of FETs 1, 2 make up high-frequency switch 121. Similarly, FETs 3, 4 and resistive elements 63, 64 make up high-frequency switch 122. FETs 5, 6 and resistive elements 65, 66 make up high-frequency switch 123, and FETs 7, 8 and resistive elements 67, 68 make up high-frequency switch 124. The voltage boosting circuits and the voltage lowering circuits employ those in the high-frequency switch circuit shown in FIG. 37. Each of potential dividing elements 141 to 146 employs single resistive element 80. Potential combining circuits 171, 172 employ the arrangement shown in FIG. 36. Resistor 173 is inserted between control potential input terminal 111 and the output terminal of potential combining circuit 171. Similarly, resistor 174 is inserted between control potential input terminal 112 and the output terminal of potential combining circuit 172.

In the above embodiment, the SPDT arrangement has basically been described. However, the circuit according to the present invention is not limited to the SPDT switch, but is also applicable to an SPnT or multiple-input, multiple-output switch. While the high-frequency detecting terminals are the input and output terminals of the high-frequency switches in the above embodiment, the cascade connection terminal of high-frequency switches or the output terminal of a high-frequency switch may be used as a high-frequency detecting terminal for the same advantages.

In the seventh, eighth, ninth, and tenth embodiments of the present invention, the detecting terminals are the junction between high-frequency switches or the input and output terminals of the high-frequency switch means. Potential dividing elements may be connected between any two points of the junction and the input and output terminals, and the junctions between the potential dividing elements may be used as detecting terminals for the same advantages.

In the eighth, ninth, and tenth embodiments, if the voltage boosting circuit and the voltage lowering circuit are of the same circuit arrangement except that the polarity of the diode element is reversed, then the most preferable advantages can be achieved. However, the voltage boosting circuit and the voltage lowering circuit may not necessarily be of the same circuit arrangement. If a circuit arrangement is employed for making an increase caused in the potential by the voltage boosting circuit greater than a reduction caused in the potential by the voltage lowering circuit, then it is possible to increase the potential at the control terminal of the high-frequency switch in an ON-state and lower the potential at the control terminal of the high-frequency switch in an OFF-state. Conversely, a reduction caused in the potential by the voltage lowering circuit may be made greater than an increase caused in the potential by the voltage boosting circuit. In these cases, too, the handling power is increased.

The preferred embodiments of the present invention have been described with respect to examples where N-channel FETs are employed in high-frequency switches. The present invention is not limited to those embodiments, but is also applicable to examples where P-channel FETs or pin diodes are employed in high-frequency switches. If P-channel FETs are employed, then the polarity of control potentials is reversed. High-frequency switch circuits which employ such P-channel FETs or pin diodes are included in the technical scope of attached claims.

The invention claimed is:

1. A high-frequency switch circuit comprising:
   a plurality of high-frequency switch means for passing and blocking a high-frequency signal between an input terminal and an output terminal depending on a control potential applied as a control signal:
   detecting means for detecting the high-frequency signal which passes though said high-frequency switch means; and
   a control potential generating circuit for changing the control potential applied to at least one of said plurality of high-frequency switch means in order to increase difference between the control potential applied to the high-frequency switch means which is in an ON-state and the control potential applied to a second high-frequency switch means of said plurality of high-frequency switch means which is in an OFF-state, depending on an amplitude of the high-frequency signal detected by said detecting means, said control potential generating circuit being connected between an output of said detecting means and a control input terminal of said high-frequency switch means associated with said detecting means.

2. The high-frequency switch circuit according to claim 1, wherein said control potential generating circuit has means for increasing said control potential applied to at least the high-frequency switch means which is in said ON-state and/or means for decreasing said control potential applied to at least the high-frequency switch means which is in said OFF-state.

3. The high-frequency switch circuit according to claim 1 or 2, wherein said control potential generating circuit has a voltage boosting circuit for increasing a potential depending on an amplitude of an input signal and/or a voltage lowering circuit for decreasing a potential depending on the amplitude of said input signal.

4. The high-frequency switch circuit according to claim 1, wherein said control potential generating circuit has a voltage boosting circuit for increasing a potential depending on the amplitude of an input signal in order to increase said control potential applied to at least the high-frequency switch means which is in said ON-state, depending on the amplitude of the high-frequency signal detected by said detecting means.

5. The high-frequency switch circuit according to claim 1, wherein said control potential generating circuit has a voltage lowering circuit for decreasing a potential depending on the amplitude of an input signal in order to decrease said control potential applied to at least the high-frequency switch means which is in said OFF-state, depending on the amplitude of the high-frequency signal detected by said detecting means.

6. The high-frequency switch circuit according to claim 1, wherein said control potential generating circuit has a voltage boosting circuit for increasing a potential depending on an amplitude of an input signal, a voltage lowering circuit for decreasing a potential depending on the amplitude of said input signal and a potential combining circuit for combining an output potential from said voltage boosting circuit and an output potential from said voltage lowering circuit into a control potential applied to at least one of said plurality of high-frequency switch means; and wherein the control potential applied to at least the high-frequency switch means which is in said ON-state is increased, and/or the control potential applied to at least the high-frequency switch means which is in said OFF-state is decreased.

7. The high-frequency switch circuit according to claim 4, wherein each of said high-frequency switch means has one or more high frequency switches connected in cascade for passing and blocking the high-frequency signal between the input terminals and the output terminals depending on said control signal which is applied;
wherein said detecting means has first and second potential dividing elements connected in cascade between two points which are selected from junctions between the high frequency switches connected in cascade, the input terminals of said high-frequency switch means, and output terminals of said high-frequency switch means, and a junction between said first and second potential dividing elements serves as a detecting terminal.

8. The high-frequency switch circuit according to claim 6, wherein each of said high-frequency switch means has one or more high frequency switches connected in cascade for passing and blocking the high-frequency signal between an input end and an output end depending on said control signal which is applied;
wherein said detecting means has first and second potential dividing elements connected in cascade between two points which are selected from junctions between the high frequency switches connected in cascade, input terminals of said high-frequency switch means, and output terminals of said high-frequency switch means, and a junction between said first and second potential dividing elements serves as a detecting terminal.

9. The high-frequency switch circuit according to claim 5, wherein each of said high-frequency switch means has one or more high frequency switches connected in cascade for passing and blocking the high-frequency signal between an input end and an output end depending on said control signal which is applied;
wherein said detecting means has first and second potential dividing elements connected in cascade between two points which are selected from junctions between the high frequency switches connected in cascade, input terminals of said high-frequency switch means, and output terminals of said high-frequency switch means, and a junction between said first and second potential dividing elements serves as a detecting terminal.

10. The high-frequency switch circuit according to claim 6, wherein each of said high-frequency switch means has one or more high frequency switches connected in cascade for passing and blocking the high-frequency signal between an input end and an output end depending on said control signal which is applied;
wherein said detecting means has first and second potential dividing elements connected in cascade between two points which are selected from junctions between the high frequency switches connected in cascade, input terminals of said high-frequency switch means, and output terminals of said high-frequency switch means, and a junction between said first and second potential dividing elements serves as a detecting terminal.

11. The high-frequency switch circuit according to claim 6, wherein each of said high-frequency switch means has one or more high frequency switches connected in cascade for passing and blocking the high-frequency signal between an input end and an output end depending on said control signal which is applied;
wherein said detecting means has first, second, and third potential dividing elements connected in cascade between two points which are selected from junctions between the high frequency switches connected in cascade, input terminals of said high-frequency switch means, and output terminals of said high-frequency switch means, and a first junction between said first and second potential dividing elements and a second junction between said second and third potential dividing elements serve as detecting terminals.

12. The high-frequency switch circuit according to any one of claims 7 to 11, wherein each of said potential dividing elements comprises at least one selected from a resistive element, a capacitive element, and an inductive element.

13. The high-frequency switch circuit according to claim 4, wherein each of said high-frequency switch means has two high frequency switches connected in cascade for passing and blocking the high-frequency signal between an input end and an output end depending on said control signal which is applied;
wherein said detecting means has either one of a junction between said two high frequency switches, input terminals of said high-frequency switch means, and output terminals of said high-frequency switch means, as a detecting terminal.

14. The high-frequency switch circuit according to claim 5, wherein each of said high-frequency switch means has two high frequency switches connected in cascade for passing and blocking the high-frequency signal between an input end and an output end depending on said control signal which is applied;
wherein said detecting means has either one of a junction between said two high frequency switches, input terminals of said high-frequency switch means, and output terminals of said high-frequency switch means, as a detecting terminal.

15. The high-frequency switch circuit according to claim 6, wherein each of said high-frequency switch means has two or more high frequency switches connected in cascade for passing and blocking the high-frequency signal between an input end and an output end depending on said control signal which is applied;
wherein said detecting means has either two of junctions between said high frequency switches connected in cascade, input terminals of said high-frequency switch means, and output terminals of said high-frequency switch means, as detecting terminals.

16. The high-frequency switch circuit according to claim 7, wherein said voltage boosting circuit has a control potential output terminal for outputting the control potential applied to said high-frequency switch means, a signal detector connected between said detecting terminal and said control potential output terminal, a control signal input terminal for being supplied with said control signal from an external circuit, and a circuit including a rectifying element connected between said control potential output terminal and said control signal input terminal.

17. The high-frequency switch circuit according to claim 8, wherein said voltage boosting circuit has a control potential output terminal for outputting the control potential applied to said high-frequency switch means, a signal detector connected between said detecting terminal and said control potential output terminal, a control signal input terminal for being supplied with said control signal from an external circuit, and a circuit including a rectifying element connected between said control potential output terminal and said control signal input terminal.

18. The high-frequency switch circuit according to claim 13, wherein said voltage boosting circuit has a control potential output terminal for outputting the control potential applied to said high-frequency switch means, a signal detector connected between said detecting terminal and said control potential output terminal, a control signal input terminal for being supplied with said control signal from an external circuit, and a circuit including a rectifying element connected between said control potential output terminal and said control signal input terminal.

19. The high-frequency switch circuit according to claim 9, wherein said voltage lowering circuit has a control potential output terminal for outputting the control potential applied to said high-frequency switch means, a signal detector connected between said detecting terminal and said control potential output terminal, a control signal input terminal for being supplied with a control signal from an external circuit, and a circuit including a rectifying element connected between said control potential output terminal and said control signal input terminal.

20. The high-frequency switch circuit according to claim 10, wherein said voltage lowering circuit has a control potential output terminal for outputting the control potential applied to said high-frequency switch means, a signal detector connected between said detecting terminal and said control potential output terminal, a control signal input terminal for being supplied with a control signal from an external circuit, and a circuit including a rectifying element connected between said control potential output terminal and said control signal input terminal.

21. The high-frequency switch circuit according to claim 14, wherein said voltage lowering circuit has a control potential output terminal for outputting the control potential applied to said high-frequency switch means, a signal detector connected between said detecting terminal and said control potential output terminal, a control signal input terminal for being supplied with a control signal from an external circuit, and a circuit including a rectifying element connected between said control potential output terminal and said control signal input terminal.

22. The high-frequency switch circuit according to any one of claims 16 to 21, wherein said circuit including the rectifying element has a resistive element connected between said control potential output terminal and said control signal input terminal, and a circuit connected parallel to said resistive element;
wherein said circuit connected parallel to said resistive element comprises a rectifying element or a series-connected circuit of a rectifying element and a circuit including a resistive element;
wherein said circuit including the resistive element has a circuit comprising a resistive element and/or an inductive element, or a circuit comprising a parallel-connected arrangement of a circuit comprising a resistive element and/or an inductive element and a circuit comprising at least one of a resistive element, an inductive element, and a capacitive element.

23. The high-frequency switch circuit according to claim 11, wherein said voltage boosting circuit has an increased potential output terminal for outputting a boosted potential, a first control signal input terminal for being supplied with a control signal from an external circuit, a first detecting terminal for detecting a high-amplitude signal, a circuit including a rectifying element connected between said first control signal input terminal and said increased potential output terminal, and a first signal detector connected between said increased potential output terminal and said first detecting terminal; wherein said voltage lowering circuit has a decreased potential output terminal for outputting a lowered potential, a second control signal input terminal for being supplied with a control signal from an external circuit, a second detecting terminal for detecting a high-amplitude signal, a circuit including a rectifying element connected between said second control signal input terminal and said decreased potential output terminal, and a second signal detector connected between said decreased potential output terminal and said second detecting terminal; wherein said potential combining circuit has a circuit including a first resistive element connected between said increased potential output terminal and a control potential output terminal for outputting the control potential applied to said high-frequency switch means, and a circuit including a second resistive element connected between said decreased potential output terminal and said control potential output terminal; wherein each of said circuits including the resistive element has a circuit comprising a resistive element and/or an inductive element, or a circuit comprising a parallel-connected arrangement of a circuit comprising a resistive element and/or an inductive element and a circuit comprising at least one of a resistive element, an inductive element, and a capacitive element.

24. The high-frequency switch circuit according to claim 23, wherein said circuit including the rectifying element in said voltage boosting circuit has a rectifying element or a series-connected circuit of a rectifying element and a circuit including a first resistive element, connected between said increased potential output terminal and said first control signal input terminal; wherein said circuit including the rectifying element in said voltage lowering circuit has a rectifying element or a series-connected circuit of a rectifying element and a circuit including a second resistive element, connected between said decreased potential output terminal and said second control signal input terminal; wherein each of said circuits including the resistive element has a circuit comprising a resistive element and/or an inductive element, or a circuit comprising a parallel-connected arrangement of a circuit comprising a resistive element and/or an inductive element and a circuit comprising at least one of a resistive element, an inductive element, and a capacitive element.

25. The high-frequency switch circuit according to claim 23, wherein said voltage boosting circuit has a circuit including a third resistive element parallel to said rectifying element between said increased potential output terminal and said first control signal input terminal; wherein said circuit including the third resistive element has a circuit comprising a resistive element and/or an inductive element or a circuit comprising a parallel-connected arrangement of a circuit comprising a resistive element and/or an inductive element and a circuit comprising at least one of a resistive element, an inductive element, and a capacitive element.

26. The high-frequency switch circuit according to claim 23, wherein said voltage lowering circuit has a circuit including a fourth resistive element parallel to said rectifying element between said decreased potential output terminal and said second control signal input terminal; wherein said circuit including the fourth resistive element has a circuit comprising a resistive element and/or an inductive element, or a circuit comprising a parallel-connected arrangement of a circuit comprising a resistive element and/or an inductive element and a circuit comprising at least one of a resistive element, an inductive element, and a capacitive element.

27. The high-frequency switch circuit according to any one of claims 16 to 21, wherein said signal detector has a circuit connected by only a capacitive element or a circuit including a capacitive element, between the corresponding detecting terminal and the corresponding potential output terminal, and said circuit including the capacitive element has a circuit comprising a series-connected arrangement of an element group comprising at least one of a resistive element, an inductive element, and a capacitive element, and a capacitive element.

28. The high-frequency switch circuit according to any one of claims 7 to 11 and 13 to 21, wherein each of said high-frequency switches has a plurality of field-effect transistors having channels connected in cascade between said input terminal and said output terminal of the high-frequency switch, and a plurality of resistive elements associated respectively with said field-effect transistors and having ends connected to the gates of the corresponding field-effect transistors and other ends connected in common for application of said control signal thereto.

29. The high-frequency switch circuit according to claim 28, further including resistive elements associated respectively with said field-effect transistors and interconnecting drains and sources thereof.

30. The high-frequency switch circuit according to any one of claims 1, 2, 4 to 11 and 13 to 21, wherein said control potential generating circuit is associated with each of said high-frequency switch means.

31. The high-frequency switch circuit according to claim 15, wherein said voltage boosting circuit has an increased potential output terminal for outputting a boosted potential, a first control signal input terminal for being supplied with a control signal from an external circuit, a first detecting terminal for detecting a high-amplitude signal, a circuit including a rectifying element connected between said first control signal input terminal and said increased potential output terminal, and a first signal detector connected between said increased potential output terminal and said first detecting terminal;

wherein said voltage lowering circuit has a decreased potential output terminal for outputting a lowered potential, a second control signal input terminal for being supplied with a control signal from an external circuit, a second detecting terminal for detecting a high-amplitude signal, a circuit including a rectifying element connected between said second control signal input terminal and said decreased potential output terminal, and a second signal detector connected between said decreased potential output terminal and said second detecting terminal;

wherein said potential combining circuit has a circuit including a first resistive element connected between said increased potential output terminal and a control potential output terminal for outputting the control potential applied to said high-frequency switch means, and a circuit including a second resistive element connected between said decreased potential output terminal and said control potential output terminal;

wherein each of said circuits including the resistive element has a circuit comprising a resistive element and/or an inductive element, or a circuit comprising a parallel-connected arrangement of a circuit comprising a resistive element and/or an inductive element and a circuit comprising at least one of a resistive element, an inductive element, and a capacitive element.

32. The high-frequency switch circuit according to claim 31, wherein said circuit including the rectifying element in said voltage boosting circuit has a rectifying element or a series-connected circuit of a rectifying element and a circuit including a first resistive element, connected between said increased potential output terminal and said first control signal input terminal;

wherein said circuit including the rectifying element in said voltage lowering circuit has a rectifying element or a series-connected circuit of a rectifying element and a circuit including a second resistive element, connected between said decreased potential output terminal and said second control signal input terminal;

wherein each of said circuits including the resistive element has a circuit comprising a resistive element and/or an inductive element, or a circuit comprising a parallel-connected arrangement of a circuit comprising a resistive element and/or an inductive element and a circuit comprising at least one of a resistive element, an inductive element, and a capacitive element.

33. The high-frequency switch circuit according to claim 31, wherein said voltage boosting circuit has a circuit including a third resistive element parallel to said rectifying element between said increased potential output terminal and said first control signal input terminal;

wherein said circuit including the third resistive element has a circuit comprising a resistive element and/or an inductive element or a circuit comprising a parallel-connected arrangement of a circuit comprising a resistive element and/or an inductive element and a circuit comprising at least one of a resistive element, an inductive element, and a capacitive element.

34. The high-frequency switch circuit according to claim 31, wherein said voltage lowering circuit has a circuit including a fourth resistive element parallel to said rectifying element between said decreased potential output terminal and said second control signal input terminal;

wherein said circuit including the fourth resistive element has a circuit comprising a resistive element and/or an inductive element, or a circuit comprising a parallel-connected arrangement of a circuit comprising a resistive element and/or an inductive element and a circuit comprising at least one of a resistive element, an inductive clement, and a capacitive element.

* * * * *